United States Patent
Camm et al.

(10) Patent No.: US 6,963,692 B2
(45) Date of Patent: Nov. 8, 2005

(54) HEAT-TREATING METHODS AND SYSTEMS

(75) Inventors: David Malcolm Camm, Vancouver (CA); J. Kiefer Elliot, Austin, TX (US)

(73) Assignee: Vortek Industries Ltd., Vancouver (CA)

( * ) Notice: Subject to any disclaimer, the term of this patent is extended or adjusted under 35 U.S.C. 154(b) by 0 days.

(21) Appl. No.: 10/427,094

(22) Filed: Apr. 30, 2003

(65) Prior Publication Data

US 2003/0206732 A1 Nov. 6, 2003

Related U.S. Application Data

(62) Division of application No. 09/729,747, filed on Dec. 4, 2000, now Pat. No. 6,594,446.

(51) Int. Cl.⁷ .............................. F26B 19/00
(52) U.S. Cl. .................. 392/416; 392/418; 392/423; 219/390; 219/388; 219/121.6; 219/121.85; 219/405; 219/411; 118/724; 118/725; 438/5; 438/486; 438/149; 438/308; 438/928; 438/295
(58) Field of Search ............................ 219/390, 405, 219/411, 388, 121.6, 121.85, 121.81; 392/416, 418, 423, 424; 118/724, 725, 50.1; 438/5, 14, 486, 487, 149, 166, 308, 928, 795

(56) References Cited

U.S. PATENT DOCUMENTS

| 1,587,023 A | 6/1926 | Mottlau |
| RE24,296 E | 3/1957 | Stewart |

(Continued)

FOREIGN PATENT DOCUMENTS

| EP | 0 399 662 A2 | 11/1990 |
| EP | 0 598 409 | 5/1994 |
| GB | 938699 | 12/1960 |
| GB | 2065973 A | 7/1981 |
| JP | 55-115327 | 9/1980 |
| JP | 56-48128 | 5/1981 |
| JP | 0080729 | 5/1982 |
| JP | 57-208146 | 12/1982 |
| JP | 02294027 A | 5/1990 |
| NO | 32864 | 8/1921 |
| WO | WO 00/67298 | 11/2000 |

OTHER PUBLICATIONS

J. Lue, "Arc Annealing of BF+2 Implanted Silicon by a Short Pulse Flash Lamp," Appl. Phys. Lett, vol. 36, No. 1, p. 73–76, dated Jan. 1, 1980.

M. LeFrancois and D. Camm, "Temperature Uniformity During Impulse™ Anneal." 8th International Conference on Advanced Thermal Processing of Semiconductors, RTP 2000, pp. 1–6, dated Sep. 20–22, 2000.

(Continued)

Primary Examiner—Shawntina Fuqua
(74) Attorney, Agent, or Firm—Knobbe, Martens, Olson & Bear, LLP

(57) ABSTRACT

A method involves increasing a temperature of a workpiece over a first time period to an intermediate temperature, and heating a surface of the workpiece to a desired temperature greater than the intermediate temperature, the heating commencing within less time following the first time period than the first time period. Another method involves pre-heating the workpiece from an initial temperature to an intermediate temperature, and heating a surface of the workpiece to a desired temperature greater than the intermediate temperature by an amount less than or equal to about one-fifth of a difference between the intermediate and initial temperatures. Another method involves irradiating a first side of the workpiece to pre-heat the workpiece to an intermediate temperature, and irradiating a second side of the workpiece to heat the second side to a desired temperature greater than the intermediate temperature.

67 Claims, 7 Drawing Sheets

U.S. PATENT DOCUMENTS

| | | | |
|---|---|---|---|
| 2,981,819 A | | 4/1961 | Gregory |
| 3,047,438 A | | 7/1962 | Marinace |
| 3,108,713 A | | 10/1963 | Barrett et al. |
| 3,160,517 A | | 12/1964 | Jenkin |
| 3,188,459 A | | 6/1965 | Bridwell |
| 3,227,065 A | | 1/1966 | Litman |
| 3,239,651 A | | 3/1966 | Silberman |
| 3,240,915 A | | 3/1966 | Carter et al. |
| 3,460,510 A | | 8/1969 | Currin |
| 3,502,516 A | | 3/1970 | Henker |
| 3,623,712 A | | 11/1971 | McNeilly et al. |
| 3,627,590 A | | 12/1971 | Mammel |
| 3,661,637 A | | 5/1972 | Sirtl |
| 3,692,572 A | | 9/1972 | Strehlow |
| 3,836,751 A | | 9/1974 | Anderson |
| 3,913,872 A | | 10/1975 | Weber |
| 4,041,278 A | | 8/1977 | Boah |
| 4,081,313 A | | 3/1978 | McNeilly et al. |
| 4,097,226 A | | 6/1978 | Erikson et al. |
| 4,101,759 A | | 7/1978 | Anthony et al. |
| 4,115,163 A | | 9/1978 | Gorina et al. |
| 4,151,008 A | * | 4/1979 | Kirkpatrick ................ 438/799 |
| 4,164,643 A | | 8/1979 | Peart et al. |
| 4,220,483 A | | 9/1980 | Cazcarra |
| 4,224,096 A | | 9/1980 | Osborne |
| 4,233,493 A | | 11/1980 | Nath |
| 4,308,078 A | | 12/1981 | Cook |
| 4,315,130 A | | 2/1982 | Inagaki et al. |
| 4,331,485 A | | 5/1982 | Gat |
| 4,370,175 A | | 1/1983 | Levatter |
| 4,375,993 A | | 3/1983 | Mori et al. |
| 4,379,727 A | | 4/1983 | Hansen et al. |
| 4,398,094 A | | 8/1983 | Hiramoto |
| 4,421,048 A | | 12/1983 | Adema et al. |
| 4,431,459 A | | 2/1984 | Teng |
| 4,455,479 A | | 6/1984 | Itoh et al. |
| 4,493,977 A | | 1/1985 | Arai et al. |
| 4,533,820 A | | 8/1985 | Shimizu |
| 4,539,431 A | | 9/1985 | Moddel et al. |
| 4,540,876 A | | 9/1985 | McGinty |
| 4,550,245 A | | 10/1985 | Arai et al. |
| 4,550,684 A | | 11/1985 | Mahawili |
| 4,567,352 A | | 1/1986 | Mimura et al. |
| 4,649,261 A | | 3/1987 | Sheets |
| 4,680,447 A | | 7/1987 | Mahawili |
| 4,698,486 A | | 10/1987 | Sheets |
| 5,219,786 A | * | 6/1993 | Noguchi ........................ 438/5 |
| 5,336,641 A | | 8/1994 | Fair et al. |
| 5,359,693 A | | 10/1994 | Nenyei et al. .............. 392/418 |
| 5,399,506 A | | 3/1995 | Tsukamoto |
| 5,446,825 A | | 8/1995 | Moslehi et al. |
| 5,561,735 A | * | 10/1996 | Camm ........................ 392/416 |
| 5,628,564 A | | 5/1997 | Nenyei et al. .............. 374/121 |
| 5,727,017 A | | 3/1998 | Maurer et al. .................. 374/9 |
| 5,841,110 A | | 11/1998 | Nenyei et al. .............. 219/497 |
| 5,908,307 A | | 6/1999 | Talwar et al. |
| 5,960,158 A | | 9/1999 | Gat et al. ................... 392/416 |
| 6,051,483 A | | 4/2000 | Lee et al. |
| 6,293,696 B1 | | 9/2001 | Guardado ...................... 374/2 |
| 6,303,411 B1 | | 10/2001 | Camm et al. |
| 2002/0102098 A1 | | 8/2002 | Camm et al. |
| 2004/0105670 A1 | | 6/2004 | Kusuda et al. |
| 2004/0112890 A1 | | 6/2004 | Kusuda et al. |

OTHER PUBLICATIONS

A.T. Fiory, K.K. Bourdelle, P.K. roy and S.P. McCoy, "Spike Annealing of Implanted PMOS Gates," Proc. of RTP 2000 Conference, pp. 1–8, dated Sep. 20–22, 2000.

D.M. Camm and B. Lojek, "High Power Arc Lamp RTP System for High Temperature Annealing Applications," $2^{nd}$ International Rapid Thermal Conference, pp. 1–7, (1994).

A.T. Fiory, K.K. Bourdelle, M.E. Lefrancois, D.M. Camm and A. Agarwal, "Electrical Measurements of Annealed Boron Implants for Shallow Junctions," Advances in Rapid Thermal Processing, vol. 99–10, pp. 133–140, (1999).

D.M. Camm and M. Lefrancois, "Spike Thermal Processing Using Arc Lamps," Advances in Rapid Thermal Processing, (2000).

A.T. Fiory, D.M. Camm, M.E. Lefrancois, S.P. McCoy and A. Agarwal, "Annealing Ultra–Low Energy Boron Implants with an Arc Lamp System," RTP 1999, pp. 273–280 (1999).

Semiconductor Industry Association, "International Technology Roadmap for Semiconductors," International Sematech, Austin Texas, pp. 7, 14, pp. 123–131 (1999).

"Products, Capabilities," Tamarach Scientific Co., Inc.

"Searchlight Model–100," Tamarack Scientific Co., Inc.

A.R. Lunde, "Nasa Tech Brief," B75–1008, Lewis Research Center, dated Apr. 1975.

"Transient Calorimeter Calibration System," AFFDL–TR–75–24, Tamarack Scientific Company, Orange, California, pp. 1–50, dated Mar. 1975.

N.S. Kapany, J.A. Eyer and R.E. Keim, "Fiber Optics. Part II Image Transfer on Static and Dynamic Scanning with Fiber Bundles," Journal of the Optical Society of America, vol. 47, No. 5, pp. 423–427, dated May 1957.

R. J. Potter, "Transmission Properties of Optical Fibers," Journal of the Optical Society of America, vol. 51, No. 10, pp. 1079–1089, dated Oct. 1961.

D. E. Williamson, "Cone Channel Condenser Optics," Journal of the Optical Society of America, vol. 42, No. 10, pp. 712–715, dated Oct. 1952.

R.L. Cohen, J.S. Williams, L.C. Feldman and K.W. West, Thermally Assisted Flash Annealing of Silicon and Germanium, Bell Laboratories, Murray Hill, New Jersey, pp. 1–4.

R.J. von Gutfeld, "Crystallization of Silicon for Solar Cell Applications," IBM Technical Disclosure, vol. 19, IBM Corp., pp. 3955–3956, dated Mar. 1977.

T.O. Sedgwick, "Short Time Annealing," J. Electrochem. Soc., vol. 130, No. 2, pp. 484–492, dated Feb. 1983.

P.S. Burggraaf, "Rapid Wafer Healing: Status 1983," Semiconductor International, pp. 69–74, dated Dec. 1983.

A. Gat and S. Shatas, "Introduction to Heatpulse ™Processing Technology," AG Associates, Mountain View, California, pp. 1–29.

J.C. Gelpey and P. O. Stump, "Rapid Optical Annealing Using the Water–Wall DC Arc Lamp." Microelectronic Manufacturing and Testing, pp. 22–24, dated Aug. 1983.

M.M. Chen, J.B. Berkowitz–Mattuck and P.E. Glaser, "The Use of a Kaleidoscope to Obtain Uniform Flux Over a Large Area in a Solar or Arc Imaging Furnace," Applied Optics, vol. 2, No. 3, pp. 265–271, dated Mar. 1963.

R. Klabes, J. Matthal, M. Voelskow and S. Mutze, "Pulsed Incoherent Light Annealing of Arsenic and Phosphorous Implanted Polycrystalline Silicone," Physica Status Solidi, pp. K5–7, K9–12 (1982).

A. Lietoila, R.B. Gold and J.F. Gibbons, "Temperature Rise Induced in Si by Continuous Xenon Arc Lamp Radiation," American Institute of Physics, vol. 53, No. 2, pp. 1169–1172, dated Feb. 1982.

R.A. Powell and R.T. Fulks, "Annealing of Implantation Damage in Integrated–Circuit Devices Using an Incoherent Light Source," American Vacuum Society, pp. 32–36, dated Jan. 1982.

J.C. Gelpey, P.O. Stump and J.W. Smith, "Process Control for a Rapid Optical Annealing System," Mat. Res. Soc. Symp. Press, vol. 52 (1986).

J.H. Myer, "Zoomable Kaleidoscopic Mirror Tunnel," Applied Optics, vol. 10, No. 9, pp. 2179–2182, dated Sep. 1971.

J.H. Myer, "Zoomable Kaleidoscopic Mirror Tunnel," Applied Optics, vol. 10, No. 9, pp. 2179–2182, dated Sep. 1971.

"RTP–800 Rapid Thermal Processor," Extrion Division Semiconductor Equipment Group, Varian, pp. 1–6, dated Dec. 1985.

K. Nishiyama, M. Aral and N. Watanabe, "Radiation Annealing of Boron–Implanted Silicon with a Halogen Lamp," Japanese Journal of Applied Physics, vol. 19, No. 10, pp. L563–L566, dated Oct. 1980.

M. Current and A. Yee, "Ion Implantation and Rapid Annealing of 125 nm Wafers," Solid State Technology, pp. 197–202, dated Oct. 1983.

D.J. Lischner and G.K. Celler, "Rapid Large Area Annealing of Ion–Implanted Si with Incoherent Light," Laser and Electron–Beam Interactions with Solids, Elsevier Science Publishing Company, Inc., pp. 751–758, (1982).

J.C. C. Fan, B–& Tsaur and M.W. Gels, "Transient Heating with Graphite Heaters for Semiconductor Processing," Laser and Electron–Beam Interactions with Solids, Elsevier Science Publishing Company, Inc., pp. 751–758 (1982).

R.L. Cohen, J .S. Williams, L.C. Feldman and K.W. West, "Thermally Assisted Flash Annealing of Silicon and Germanium," Appl. Phys. Lett., vol. 33, No. 8, pp. 751–753, dated Oct. 1978.

H.A. Bomke, H.L. Berkowitz, M. Harmatz, S. Kronenberg and R. Lux, "Annealing of Ion–Implanted Silicon by an Incoherent Light Pulse," Appl. Phys. Lett., vol. 33, No. 11, pp. 955–957, dated Dec. 1, 1978.

R.A. Powell, T.O. Yep and R.T. Fulke, "Activation of Arsenic–Implanted Silicon Using an Incoherent Light Source," Appl. Phys. Lett., vol. 39, No. 2, pp. 150–152, dated Jul. 15, 1981.

R.E. Sheets, "Automatic Cassette to Cassette Radiant Impulse Processor," Nuclear Instruments and Methods in Physics Research, Amsterdam, Elsevier Science Publishers B.V., pp. 219–223 (1985).

International Search Report for PCT/CA01/01706.

Tillmann, et al. "Processing of 200 and 300 nm Wafers in an Advanced Rapid Thermal Processing System," Proc RTP 1998, $6^{th}$ International Conference on Advanced Thermal Processing of Semiconductors, Kyoto, Japan, 1998, pp. 62–63.

Wilson, S.R., et al., "An Overview and Comparison of Rapid Thermal Processing Equipment: A Users Viewpoint", (1986), vol. 52, Mat. Res. Soc. Symp. Proc., p. 181–190.

Blake, Julian, et al., "Slip Free Rapid Thermal Processing", (1987), vol. 92, Mat. Res. Soc. Symp. Proc., p. 265–272.

Celler, G.K., et al., "Drift of Arsenic in $SiO_2$, in a Lamp Furnace with a Built–in Temperature Gradient", (1987), vol. 92, Mat. Res. Soc. Symp. Proc., p. 53–58.

Lord, H.A., "Thermal and Stress Analysis of Semiconductor Wafers in a Rapid Thermal Processing Oven", (Aug. 1988), vol. 1, No. 3, IEEE Transactions on Semiconductor Manufacturing, p. 105–114.

Hill, C., et al., "Rapid Thermal Annealing—Theory and Practice", in *Reduced Thermal Processing for VLSI,* (New York: Plenum, 1989), p. 143–180.

Kakoschke, R., "Is There A Way to Perfect Rapid Thermal Processing System?", (1991), vol. 224, Mat. Res. Soc. Symp. Proc., p. 159–170.

Kakoschke, R., et al., "Simulation of Temperature Effects During Rapid Thermal Processing", (1989), vol. 146, Mat. Res. Soc. Symp. Proc., p. 473–482.

Vandenabeele, P., et al., "Impact of Patterned Layers on Temperature Non–Uniformity During Rapid Thermal Processing for VLSI–Applications", (1989), vol. 146, Mat. Res. Soc. Symp. Proc., p. 149–160.

Nulman, J., et al., "Pyrometric Emissivity Measurements and Compensation in a RTP Chamber", (1989), vol. 146, Mat, Res. Soc. Symp. Proc., p. 461–466.

Dilhac, J–M., et al., "Adaptive Process Control for a Rapid Thermal Processor", (1990), SPIE vol. 1393, Rapid Thermal and Related Processing Techniques, p. 395–403.

Dilhac, J–M., et al., "Thermal Model for Rapid Thermal Processors: Theory and Applications", (1993), RTP '93 conference proceedings, p. 12–18.

\* cited by examiner

HEAT-TREATING METHODS AND SYSTEMS

CROSS-REFERENCE TO RELATED APPLICATIONS

This application is a division of U.S. patent application Ser. No. 09/729,747, filed Dec. 4, 2000 Now U.S. Pat. No. 6,594,446.

FIELD OF THE INVENTION

The present invention relates to heating of objects, and more particularly to methods and systems for heat-treating a workpiece.

BACKGROUND OF THE INVENTION

Many applications require heating or annealing of an object or workpiece. For example, in the manufacture of semiconductor chips such as microprocessors and other computer chips for example, a semiconductor wafer such as a silicon wafer is subjected to an ion implantation process, which introduces impurity atoms or dopants into a surface region of a device side of the wafer. The ion implantation process damages the crystal lattice structure of the surface region of the wafer, and leaves the implanted dopant atoms in interstitial sites where they are electrically inactive. In order to move the dopant atoms into substitutional sites in the lattice to render them electrically active, and to repair the damage to the crystal lattice structure that occurs during ion implantation, it is necessary to anneal the surface region of the device side of the wafer by heating it to a high temperature.

However, the high temperatures required to anneal the device side also tend to produce undesirable effects using existing technologies. For example, diffusion of the dopant atoms deeper into the silicon wafer tends to occur at much higher rates at high temperatures, with most of the diffusion occurring within close proximity to the high annealing temperature required to activate the dopants. As performance demands of semiconductor wafers increase and device sizes decrease, it is necessary to produce increasingly shallow and abruptly defined junctions, and therefore, diffusion depths that would have been considered negligible in the past or that are tolerable today will no longer be tolerable in the next few years or thereafter. Current industry roadmaps, such as the International Technology Roadmap for Semiconductors 1999 Edition (publicly available at http://public.itrs.net/) indicate that doping and annealing technologies will have to produce junction depths as shallow as 30 nm by 2005, and as shallow as 20 nm by 2008.

Most existing annealing technologies are incapable of achieving such shallow junction depths. For example, one existing rapid thermal annealing method involves illuminating the device side of the wafer with an array of tungsten filament lamps in a reflective chamber, to heat the wafer at a high rate. However, the wafer tends to remain hot for a considerable time after the power supply to the tungsten filaments is shut off, for a number of reasons. Typical tungsten lamps have a relatively long time constant, such as 0.3 seconds, for example, as a result of the high thermal masses of the filaments, which remain hot and continue to irradiate the wafer after the power supply to the filaments is discontinued. This slow time response of the filaments gives rise to the dominant thermal lag in such a system. Also, radiation return from the walls of the reflective process chamber provides another source of continued heating after the power is shut off. A temperature versus time profile of the wafer using this tungsten lamp annealing method tends to have a rounded top with relatively slow cooling after the power to the filaments is discontinued. Accordingly, if the wafer is heated with such a system to a sufficiently high temperature to repair the crystal lattice structure and activate the dopants, the wafer tends to remain too hot for too long a period of time, resulting in diffusion of the dopants to significantly greater depths in the wafer than the maximum tolerable diffusion depths that will be required to produce 30 nm junction depths.

Although the vast majority of dopant diffusion occurs in the highest temperature range of the annealing cycle, lowering the annealing temperature is not a satisfactory solution to the diffusion problem, as lower annealing temperatures result in significantly less activation of the dopants and therefore higher sheet resistance of the wafer, which would exceed current and/or future tolerable sheet resistance limits for advanced processing devices.

One annealing method that has achieved some success in producing shallow junctions involves the use of excimer lasers to heat and anneal the device side of the wafer. The short-wavelength monochromatic radiation produced by such lasers tends to be absorbed at very shallow depths in the device side of the wafer, and the short duration, high-power laser pulse (for example, a 10 nanosecond pulse delivering about 0.4 J/cm$^2$ to the device side surface) typically used for this process tends to heat a small localized area of the surface of the device side to melting or near-melting temperatures very rapidly, in significantly less than the time required for thermal conduction in the wafer. Accordingly, the bulk regions of the substrate of the wafer tend to remain cold and therefore act as a heat sink for the heated surface region, causing the surface region to cool very quickly. A typical surface temperature versus time profile of the localized area of the device side surface using laser annealing tends to be triangular-shaped and steeply sloped for both the heating and cooling stages and therefore, the device side spends only a very short period of time at high temperatures. Thus, the wafer does not remain hot long enough for much dopant diffusion to occur. However, because the bulk regions of the wafer, as well as device side areas other than the localized area heated by the laser, remain cold when the localized surface area of the device side is heated to annealing temperature, extreme thermal gradients are produced in the wafer, resulting in large mechanical strains which cause the crystal planes within the wafer to slip, thereby damaging or breaking the crystal lattice. In this regard, a very small spatial movement may completely destroy the crystal lattice. Thermal gradients may also cause other damage, such as warpage or defect generation. Even in the absence of slippage, a non-uniform temperature distribution across the wafer may cause non-uniform performance-related characteristics, resulting in either inadequate performance of the particular wafer, or undesirable performance differences from wafer to wafer. In addition, the large amount of energy delivered by the laser or lasers to the device side of the wafer is non-uniformly absorbed by the pattern of devices thereon, resulting in deleterious heating effects in regions of the wafer where annealing is not desired, and may also produce further large temperature gradients causing additional damage to the silicon lattice.

Other ultra-fast heating methods similar to laser annealing have also been attempted. For example, flash lamps and microwave pulse generators have been used to rapidly heat the device side of the wafer to annealing temperature, resulting in a temperature-time profile similar to that achieved by laser annealing, with similar disadvantages.

At least one approach in the early 1990s involved a low-temperature annealing stage followed by a laser annealing stage. The low-temperature stage typically involved heating the wafer to a mid-range temperature in an electric furnace, such as 600° C. for example, for a relatively long period of time, such as an hour or longer. A typical temperature-time profile of the device side surface using this method is flat for a very long time, followed by a rapid increase and rapid cooling of the surface resulting from the laser anneal. Although this method purports to reduce junction leakage currents as compared to laser annealing alone, the long duration of the low-temperature annealing stage causes the dopants to diffuse to greater depths within the device side of the wafer. Such diffusion, which may have been tolerable or perhaps even negligible by early 1990s standards, would not permit the formation of sufficiently shallow junctions to comply with current performance and industry roadmap requirements.

A more recent approach involves the use of a fast responding argon plasma arc lamp heat source to irradiate the substrate side of the wafer, to rapidly heat the entire wafer to annealing temperatures. The time response of the arc lamp is short (typically on the order of 0.1 milliseconds or less) compared to that of the wafer itself, and thus the dominant thermal lag is that of the wafer, in contrast with the tungsten lamp method above where the dominant thermal lag is that of the tungsten filaments. A typical temperature-time profile of the wafer using this method tends to have heating and cooling temperature rates that are intermediate between those of tungsten systems and laser annealing systems. Thus, the wafer spends less time at the high annealing temperature and therefore, less dopant diffusion occurs than with the tungsten lamp method. Accordingly, this method is capable of producing much shallower junction depths than tungsten lamp systems. As the entire wafer is heated rather than just the device side surface, the extreme transverse thermal gradients that result in laser annealing are avoided, thereby minimizing additional damage to the crystal lattice. In addition, as the substrate side is irradiated rather than the device side, non-uniform heating of the device side due to non-uniform absorption by the pattern of devices is also much lower than for laser annealing, resulting in lower lateral temperature gradients and reduced damage to devices. However, early indications suggest that embodiments of this method may result in somewhat deeper diffusion of the dopants than laser annealing.

Accordingly, there is a need for improved methods and systems for heat-treating a workpiece. In addition to annealing a semiconductor wafer for ion activation and lattice repair purposes, other applications would also benefit from an improved heat-treating method that addresses the above problems.

SUMMARY OF THE INVENTION

The present invention addresses the above needs by providing, in accordance with one aspect of the invention, a method and system for heat-treating a workpiece. The method involves increasing a temperature of the workpiece over a first time period to an intermediate temperature, and heating a surface of the workpiece to a desired temperature greater than the intermediate temperature. The heating is commenced within less time following the first time period than the first time period. The system includes a pre-heating device operable to increase the temperature of the workpiece and a heating device operable to heat a surface of the workpiece in the above manner. Similarly, an alternative system includes means for increasing the temperature and means for heating the surface in the above manner.

Increasing the workpiece temperature over the first time period, prior to commencing the heating of its surface, decreases the magnitude of the thermal gradients that will occur in the workpiece when the surface is heated to the desired temperature. Therefore, thermal stress in the workpiece is reduced, and where the workpiece has a crystal lattice structure, such as a semiconductor wafer for example, damage to the lattice is correspondingly reduced.

In addition, by commencing the heating within less time following the first time period than the duration of the first time period itself, the workpiece spends less time at high temperatures (in the general range of the intermediate temperature) than the time taken to increase the workpiece temperature to the intermediate temperature. Therefore, where the workpiece is a semiconductor wafer for example, the short duration of time spent at or approaching the intermediate temperature serves to minimize dopant diffusion that would otherwise occur if the workpiece spent longer times at such high temperatures.

Increasing the temperature of the workpiece preferably involves pre-heating the workpiece for a time period greater than a thermal conduction time of the workpiece. The pre-heating device may be operable to achieve this. This serves to allow much of the energy supplied to the workpiece during the pre-heating stage to conduct through the workpiece, thereby raising substantially the entire bulk of the workpiece to the intermediate temperature.

Similarly, heating preferably involves heating the surface for a time period less than a thermal conduction time of the workpiece. The heating device may be operable to achieve this. Thus, the surface may be heated quickly to the desired temperature while the bulk of the workpiece remains substantially at the cooler intermediate temperature. This allows the bulk of the workpiece to act as a heat sink for the heated surface, causing the surface to cool much more rapidly when the heating stage is completed. As dopant diffusion occurs most significantly at the highest temperature range, i.e. between the intermediate temperature and the desired temperature, this approach minimizes the time spent by the surface in this highest temperature range, thereby minimizing dopant diffusion.

Heating the surface of the workpiece preferably involves commencing the heating at an end of the first time period. The heating device may be operable to commence the heating at such a time.

Similarly, the method may further involve producing an indication of a temperature of the workpiece. Heating the surface may then involve commencing the heating in response to an indication that the temperature of the workpiece is at least the intermediate temperature. The system may include a temperature indicator operable to produce the indication of the temperature of the workpiece, and the heating device may be operable to commence the heating in response to the indication from the temperature indicator that the temperature of the workpiece is at least the intermediate temperature.

Thus, by commencing the heating of the surface as soon as the intermediate temperature is achieved, the workpiece spends even less time at the intermediate temperature, thereby further reducing the amount of dopant diffusion.

Increasing the temperature of the workpiece may involve irradiating the workpiece. In this regard, irradiating may involve exposing the workpiece to electromagnetic radiation produced by an arc lamp, or alternatively, to electromagnetic radiation produced by at least one filament lamp. Similarly, the pre-heating device may include means for irradiating the workpiece, or alternatively may include an irradiance source operable to irradiate the workpiece, and the irradiance source may include an arc lamp or at least one filament lamp, for example. Alternatively, the pre-heating device may include a hot body locatable to pre-heat the workpiece.

Increasing the temperature of the workpiece may involve pre-heating the workpiece at a rate of at least 250° C. per second. Preferably, increasing involves pre-heating the workpiece at a rate of at least 400° C. per second. The pre-heating device is preferably operable to pre-heat the workpiece at such rates. Such rapid pre-heating further reduces dopant diffusion, while allowing the temperature of the bulk of the workpiece to be increased in order to reduce thermal stresses and resulting lattice damage during subsequent heating of the surface. However, if desired, significantly slower or faster rates may be substituted.

Heating the surface of the workpiece preferably involves irradiating the surface. In this regard, irradiating may involve exposing the surface to electromagnetic radiation produced by a flash lamp, or alternatively, may involve moving a laser beam across the surface. Similarly, the heating device may include means for irradiating the surface, or may similarly include an irradiance source operable to irradiate the surface. The irradiance source may include a flash lamp or a laser, for example.

The method preferably further involves absorbing radiation reflected and thermally emitted by the workpiece. Absorbing may involve absorbing the radiation in a radiation absorbing environment, or alternatively, in at least one radiation absorbing surface. The method may further involve cooling the at least one radiation absorbing surface. Similarly, the system may further include a radiation absorbing environment, or alternatively, at least one radiation absorbing surface, operable to absorb radiation reflected and thermally emitted by the workpiece. The system may then include a cooling system operable to cool the at least one radiation absorbing surface.

If desired, increasing the temperature of the workpiece may further involve pre-heating the workpiece to the intermediate temperature, and heating the surface may involve heating the surface to a desired temperature greater than the intermediate temperature by an amount less than or equal to about one-fifth of a difference between the intermediate and initial temperatures. The heating device may be operable to perform such heating. In addition, or alternatively, increasing the temperature of the workpiece may involve irradiating a first side of the workpiece to pre-heat the workpiece to the intermediate temperature, and heating the surface may involve irradiating a second side of the workpiece to heat the second side to the desired temperature. In this regard, the pre-heating device and the heating device may include first and second irradiance sources operable to irradiate the first and second sides of the workpiece as indicated above. Advantages of these variations are discussed in connection with other aspects of the invention.

In accordance with another aspect of the invention, there is provided a method and system for heat-treating a workpiece. The method involves pre-heating the workpiece from an initial temperature to an intermediate temperature, and heating a surface of the workpiece to a desired temperature greater than the intermediate temperature by an amount less than or equal to about one-fifth of a difference between the intermediate and initial temperatures. The system may include a pre-heating device and a heating device operable to pre-heat the workpiece and to heat the surface of the workpiece respectively, in the above manner. An alternative system includes means for pre-heating the workpiece and means for heating the surface of the workpiece.

By pre-heating the workpiece in this manner, to an intermediate temperature that is relatively close to the desired temperature, the thermal gradients that are ultimately produced when the surface of the workpiece is heated to the desired temperature are reduced, resulting in lower thermal stresses in the workpiece. Where the workpiece has a crystal lattice structure such as that of a semiconductor wafer for example, this serves to reduce thermal stress damage to the lattice. At the same time, by pre-heating the workpiece to the intermediate temperature then heating the surface to the desired temperature, the surface may cool faster from the desired temperature than it would have if the entire workpiece had been heated to the desired temperature. Thus, the surface may spend less time at the high desired temperature, resulting in less dopant diffusion and therefore resulting in shallower junction formation.

Heating the surface to the desired temperature may involve heating the surface to a desired temperature greater than the intermediate temperature by an amount less than or equal to about one-tenth of the difference between the intermediate and initial temperatures. Similarly, the desired temperature may be greater than the intermediate temperature by an amount less than or equal to about one-twentieth of the difference between the intermediate and initial temperatures. The heating device may be operable to heat the surface in this manner. It has been found that these temperature relationships are particularly advantageous for some applications, such as ion activation in semiconductor wafers for example.

Similarly, the desired temperature may be at least about 1050° C., which has been found to be a suitable ion activation annealing temperature for some applications. The heating device may be operable to heat the surface to such a temperature.

Pre-heating preferably involves pre-heating the workpiece for a time period greater than a thermal conduction time of the workpiece, and heating preferably involves heating the surface for a time period less than a thermal conduction time of the workpiece, as discussed above in connection with the previous aspect of the invention. The pre-heating and heating devices are preferably operable to perform such pre-heating and heating respectively.

Pre-heating preferably involves irradiating the workpiece, as discussed in connection with the previous aspect of the invention. Similarly, the pre-heating device may include means for irradiating the workpiece, or an irradiance source operable to irradiate the workpiece, or a hot body locatable to pre-heat the workpiece, as discussed above.

Pre-heating may involve pre-heating the workpiece at a rate of at least 250° C. per second, and preferably at a rate of at least 400° C. per second, which the pre-heating device may be operable to achieve.

Heating the surface of the workpiece preferably involves irradiating the surface, as discussed in connection with the previous aspect of the invention. Thus, the heating device may include means for irradiating the surface, or alternatively an irradiance source operable to irradiate the surface, as discussed above.

The method may further involve producing an indication of a temperature of the workpiece, and heating may then involve commencing the heating in response to an indication that the temperature of the workpiece is at least the intermediate temperature, as discussed above. The system may therefore include a temperature indicator and the heating device may be operable to commence the heating in response thereto, as discussed above.

The method may further involve absorbing radiation reflected and thermally emitted by the workpiece, as previously discussed, and thus, the system may include a radiation absorbing environment or radiation absorbing surface, and may further include a cooling system.

Pre-heating may involve irradiating a first side of the workpiece to pre-heat the workpiece to the intermediate temperature, and heating may involve irradiating a second side of the workpiece to heat the second side to the desired temperature. The pre-heating and heating devices may include first and second irradiance sources operable to irradiate the first and second sides of the workpiece, respectively.

In accordance with another aspect of the invention, there is provided a method and system for heat-treating a workpiece. The method involves irradiating a first side of the workpiece to pre-heat the workpiece to an intermediate temperature, and irradiating a second side of the workpiece to heat the second side to a desired temperature greater than the intermediate temperature. The system includes first and second irradiance sources operable to irradiate the first and second sides respectively in the above manner. An alternative system includes respective means for irradiating the first and second sides in the above manner.

It has been found that irradiating the first and second sides, to pre-heat the workpiece and to heat the second side respectively in the above manner, tends to reduce the magnitude of the thermal gradients that occur when the second side is heated to the desired temperature, thereby reducing damage to the workpiece resulting from thermal stresses. In addition, where the workpiece is a semiconductor wafer for example, the combination of pre-heating of the workpiece and heating of its second side serves to reduce dopant diffusion, thereby permitting the formation of shallower junctions than other technologies which attempt to provide relatively low thermal stress damage.

Irradiating the first and second sides preferably includes irradiating a substrate side and a device side respectively of a semiconductor wafer. The first and second irradiance sources may be locatable to irradiate the substrate and device sides respectively. Due to the greater uniformity of the emissivity across the substrate side of the wafer as compared to the device side, the irradiation of the substrate side to pre-heat the wafer results in significantly greater temperature uniformity in the wafer, and therefore significantly less thermal stress damage, than other methods that deliver the entire annealing energy to the device side of the wafer. In contrast, if the device side alone was irradiated to heat the device side from room temperature to 1050° C. for example, then an emissivity difference of 10% between different devices on the device side may result in a lateral temperature difference of approximately 100° C., which is well in excess of current tolerable temperature difference limits, and may therefore cause thermal stress damage to the devices and to the lattice.

Irradiating the first side preferably involves irradiating the first side for a time period greater than a thermal conduction time of the workpiece, and the first irradiance source may be operable to achieve this. This serves to allow much of the energy supplied to the first side of the workpiece during the pre-heating stage to conduct through the workpiece, thereby raising substantially the entire bulk of the workpiece to the intermediate temperature.

Conversely, irradiating the second side preferably involves irradiating the second side for a time period less than a thermal conduction time of the workpiece. The second irradiance source may be operable to irradiate the second side in this manner. This allows the second side to be heated quickly to the desired temperature while the bulk of the workpiece remains substantially at the cooler intermediate temperature. The bulk of the workpiece may thus act as a heat sink for the heated second side, causing the second side to cool much more rapidly when the heating stage is completed. As dopant diffusion occurs most significantly at the highest temperature range, i.e. between the intermediate temperature and the desired temperature, this approach minimizes the time spent by the second side in this highest temperature range, thereby minimizing dopant diffusion.

Irradiating the first side preferably involves exposing the first side to electromagnetic radiation produced by an arc lamp, or alternatively, at least one filament lamp. Similarly, the first irradiance source may include means for irradiating the workpiece, or may include an arc lamp or at least one filament lamp.

Irradiating the first side may involve irradiating the first side with a radiation intensity sufficient to pre-heat the workpiece at a rate of at least 250° C. per second, and preferably, at a rate of at least 400° C. per second, as discussed in connection with a previous aspect of the invention. The first irradiance source may be operable to irradiate the first side at such rates.

Irradiating the second side preferably involves exposing the second side to electromagnetic radiation produced by a flash lamp, but may alternatively involve moving a laser beam across the surface. Similarly, the second irradiance source may include means for irradiating the workpiece, or may include a flash lamp or a laser.

The method may further involve producing an indication of a temperature of the workpiece, and irradiating of the second side may be commenced in response to an indication that the temperature of the workpiece is at least the intermediate temperature. Similarly, the system may include a temperature indicator and the second irradiance source may be operable to commence the irradiating of the second side in response such an indication from the temperature indicator.

The method may further involve absorbing radiation reflected and thermally emitted by the workpiece, as previously discussed, and similarly, the system may include a radiation absorbing environment, or may include at least one radiation absorbing surface, and may further include a cooling system.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
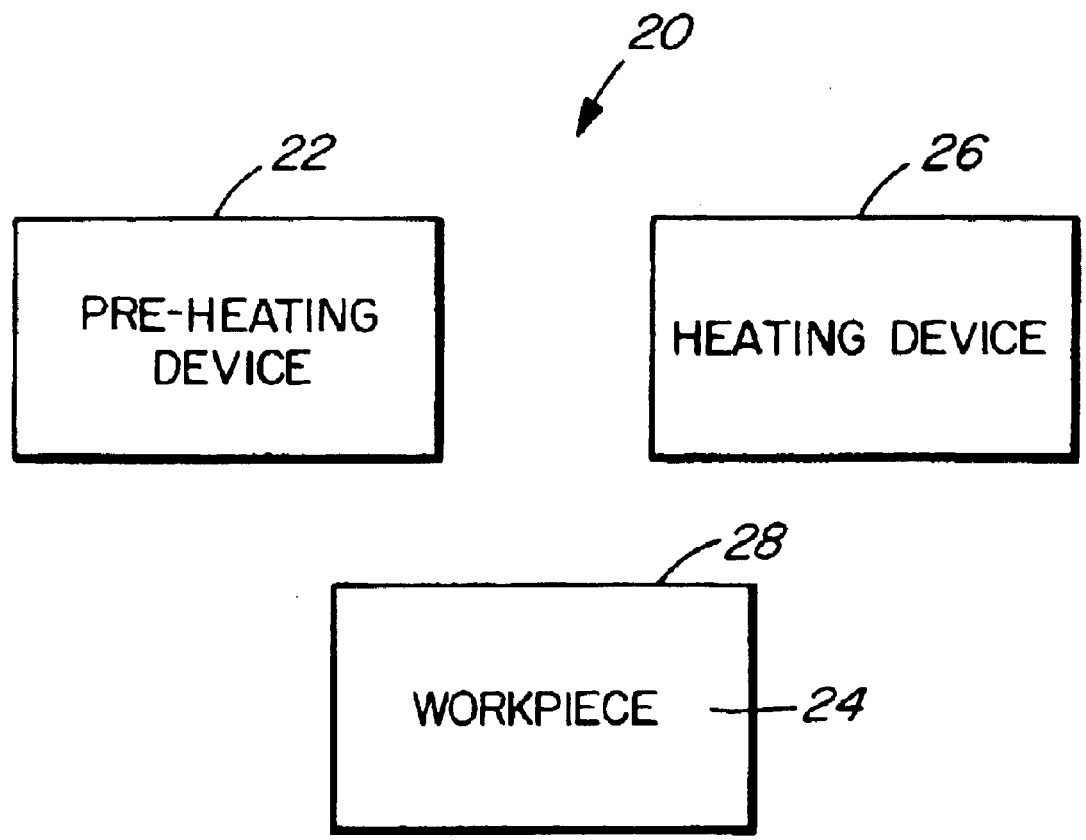
FIG. 1 is a block diagram of a system for heat-treating a workpiece, according to a first embodiment of the invention.

Referring to FIG. 1, a system for heat-treating a workpiece according to a first embodiment of the invention is shown generally at 20. The system includes a pre-heating device 22 operable to increase a temperature of a workpiece 24 over a first time period, to an intermediate temperature. The system further includes a heating device 26 operable to heat a surface 28 of the workpiece to a desired temperature greater than the intermediate temperature, and operable to commence the heating within less time following the first time period than the first time period.

System

Figure 2:
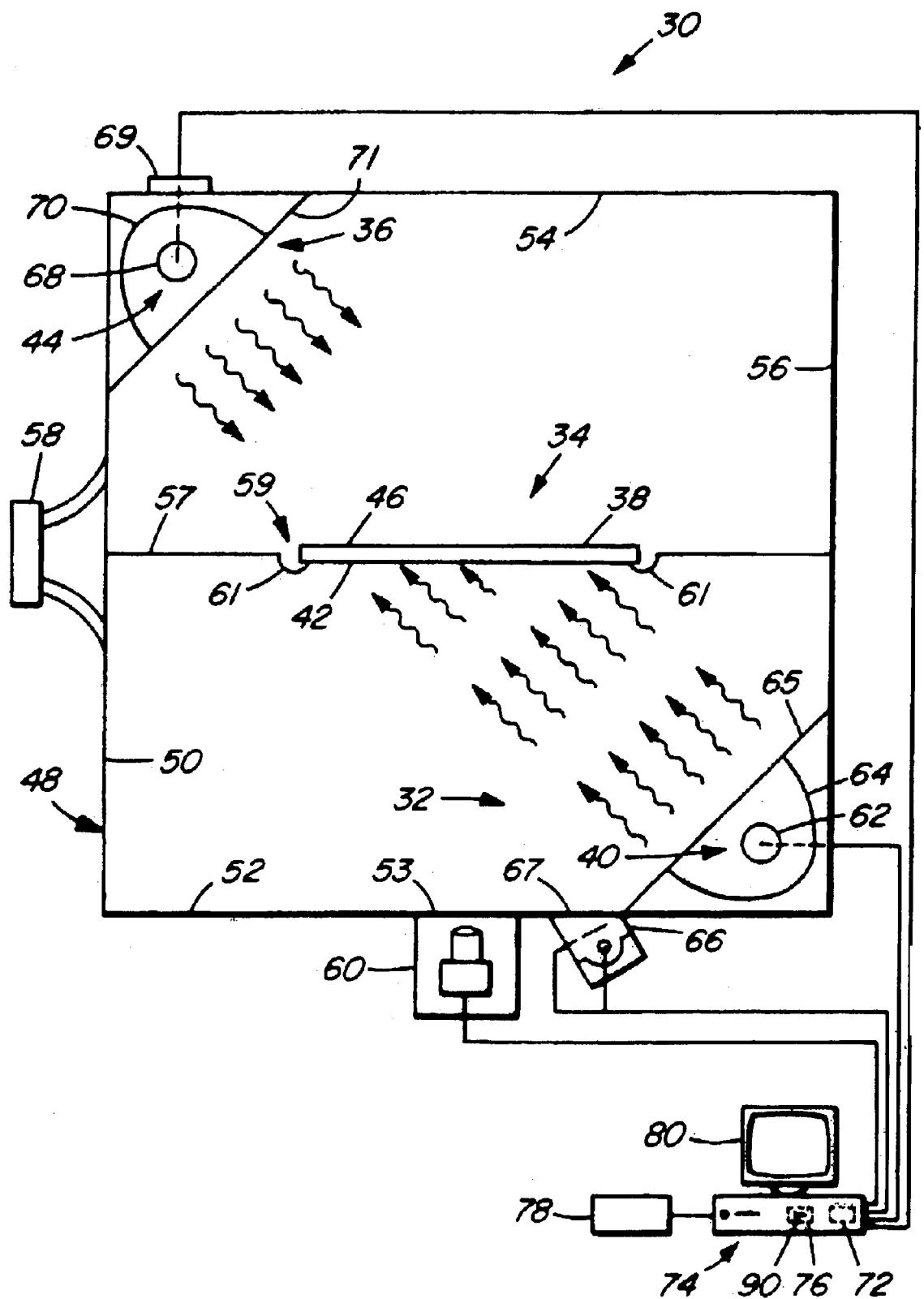
FIG. 2 is a side view of a system for heat-treating a workpiece according to a second embodiment of the invention (shown with a side wall removed)

Referring to FIG. 2, a system for heat-treating a workpiece according to a second embodiment of the invention is shown generally at 30. The system 30 includes a pre-heating device 32, operable to increase a temperature of a workpiece 34 over a first time period, to an intermediate temperature. The system further includes a heating device 36, which in this embodiment is operable to heat a surface 38 of the workpiece 34 to a desired temperature greater than the intermediate temperature, and is operable to commence the heating within less time following the first time period than the first time period.

In this embodiment, the pre-heating device 32 is operable to pre-heat the workpiece 34 from an initial temperature to the intermediate temperature, and the heating device 36 is operable to heat the surface 38 of the workpiece 34 to the desired temperature, which is greater than the intermediate temperature by an amount less than or equal to about one-fifth of a difference between the intermediate and initial temperatures. More particularly, in this embodiment the heating device is operable to heat the surface to a desired temperature greater-than the intermediate temperature by an amount less than or equal to about one-tenth, or more particularly still, less than or equal to about one-twentieth, of the difference between the intermediate and initial temperatures.

Also in this embodiment, the pre-heating device 32 includes a first irradiance source 40 operable to irradiate a first side 42 of the workpiece 34 to pre-heat the workpiece to the intermediate temperature, and the heating device 36 includes a second irradiance source 44 operable to irradiate a second side 46 of the workpiece, which in this embodiment is co-extensive with the surface 38 of the workpiece, to heat the second side 46 to the desired temperature greater than the intermediate temperature.

Process Chamber

Still referring to FIG. 2, in this embodiment, the system 30 includes a radiation absorbing environment operable to absorb radiation reflected and thermally emitted by the workpiece 34. More particularly, in this embodiment the radiation absorbing environment is provided by a black chamber 48 surrounding the workpiece 34. The black chamber 48 includes walls 50, 52, 54 and 56, each of which acts as a radiation absorbing surface operable to absorb the radiation reflected and thermally emitted by the workpiece 34. In this embodiment the walls 50, 52, 54 and 56 are made of black stainless steel. Alternatively, other suitable radiation-absorbing materials may be used, such as anodized aluminum for example. As a further alternative, the walls may be composed of virtually any thermally conductive material and coated with a radiation-absorbing substance such as paint containing graphite, for example.

Generally, the radiation-absorbing effect of the black chamber 48 serves to increase the response time of the system 30, so that the workpiece begins to cool more quickly after the pre-heating and heating devices 32 and 36 are switched off than it would if a reflective chamber were substituted for the black chamber 48. This increased system response time results in a more sharply-defined temperature profile in which the surface 38 of the workpiece 34 spends less time at the highest temperatures involved in any given thermal cycle. Where the workpiece 34 is an ion-implanted semiconductor wafer, this tends to reduce the dopant diffusion depth during the thermal cycle, allowing for the formation of shallower junctions. In addition, the black chamber 48 reduces damage to the crystal lattice of such a workpiece as compared to reflective chambers, which non-uniformly reflect radiation back to the workpiece which then non-uniformly absorbs such radiation, giving rise to increased thermal gradients and thermal stress in the workpiece. Alternatively, however, a reflective chamber may be substituted for the black chamber 48 if desired, which would increase the energy efficiency of the thermal cycle at the expense of greater dopant diffusion and thermal stress in the workpiece.

In this embodiment the system 30 further includes a cooling system 58 operable to cool the radiation absorbing walls 50, 52, 54 and 56 of the black chamber 48. More particularly, in this embodiment the cooling system 58 is a water circulation system, although alternatively other cooling systems may be substituted. Alternatively, the cooling system may be omitted, although this would be undesirable if radiation absorbing surfaces are provided, as the radiation absorbing surfaces would otherwise become hot and would continue to heat the workpiece 34 after the pre-heating and heating devices 32 and 36 are deactivated, thereby slowing the response time of the system 30.

In this embodiment the system 30 further includes a temperature indicator 60 operable to produce an indication of a temperature of the workpiece. More particularly, in this embodiment the temperature indicator 60 includes a measuring system such as that disclosed in commonly-owned Patent Cooperation Treaty Application PCT/CA00/00513, published Nov. 9, 2000 under publication number WO 00/67298, which is incorporated herein by reference. Thus, in the present embodiment the temperature indicator 60 includes a charge-coupled device (CCD) mounted beneath a quartz window 53 in the wall 52 of the black chamber 48, and further includes a CCD optics system (not shown) and a band-pass filter (not shown) interposed between the CCD and the window 53, and a radiation sensor (not shown) mounted on a lower surface of an internal wall 57 of the black chamber 48. Alternatively, other temperature indicators, such as a pyrometer for example, may be substituted for the temperature indicator. As a further alternative, the temperature of the workpiece 34 may simply be predicted from the power supplied to the workpiece, without the necessity of directly measuring the workpiece temperature.

The internal wall 57 in the black chamber 48 extends between the walls 50 and 56 of the black chamber. An annular guard ring 61 is set in a disc-shaped opening 59 in the internal wall 57 and extends radially inward into the opening 59. The guard ring 61 includes the same or similar material as the workpiece, which in this embodiment is silicon. The guard ring is used to reduce edge effects during the thermal cycle, and acts as a locator for locating the workpiece in a desired position relative to the pre-heating and heating devices. Alternatively, other means for supporting the workpiece may be substituted.

In addition, if desired, the black chamber 48 may include gas flow ports (not shown) and flow controllers (not shown) for controlling gas flows in the vicinity of the workpiece, although such elements are not necessary for typical annealing applications.

Workpiece

Still referring to FIG. 2, in this embodiment, the workpiece 34 includes a semiconductor wafer. More particularly, in this embodiment the semiconductor wafer is a silicon wafer used in the manufacture of semiconductor chips such as microprocessors and memory devices, for example. The first side 42 of the workpiece 34 is a substrate side, while second side 46 is a device side. Thus, as shown in FIG. 2, in this embodiment, the first and second irradiance sources 40 and 44 are locatable to irradiate a substrate side and a device side respectively of a semiconductor wafer. The device side (the second side 46) of the silicon wafer has been previously subjected to an ion implantation process, such as ultra-low energy boron implantation for the formation of shallow p+/n junctions, for example, to implant impurity or dopant atoms into surface regions of the device side. As a result of such ion implantation, the workpiece suffers crystalline lattice damage, and the boron implants tend to remain concentrated largely at interstitial locations where they are electrically inactive, in a high boron concentration layer produced by the implant in the vicinity of the second side 46. Therefore, the workpiece must be subjected to an annealing process to force the implants into substitutional sites in the lattice of the silicon wafer thereby rendering them electrically active, and to repair the crystalline lattice damage suffered during ion implantation.

Alternatively, however, embodiments of the present invention have applications beyond mere activation of implanted dopants and therefore the workpiece 34 may alternatively include a wafer that is to be annealed for different purposes. For example, other embodiments of the heat-treating methods and systems exemplified herein may be applied to anneal layers of metals, oxides, nitrides, silicides, silicates or hafniates on regions of the wafer. Similarly, other embodiments may also be used to thermally oxidize or to thermally nitridize regions of the wafer, or to drive chemical vapor deposition of layers on the wafer, or to drive solid state reactions within the bulk and the near surface regions of the wafer, to name but a few examples More generally, it is expected that many types of workpieces that include a base material coated with a plurality of layers of differing materials may benefit from embodiments of the heat-treating methods exemplified herein. In this regard, the base material may include a semiconductor such as silicon, silicon carbide or gallium arsenide for example, but alternatively, may include a magnetic medium used to fabricate memory media or magnetic read/write heads, or may include a glass used to fabricate flat panel displays, for example. Such workpieces may or may not have been subjected to a surface modification process such as pre-amorphization, and the layers may be either laterally continuous or discontinuous (as a result of intentional patterning) across the surfaces of the base material, or a combination of continuous and discontinuous layers.

More broadly, however, the workpiece 34 need not be any of the above types of workpieces, but may alternatively include any other type of workpiece that would benefit from the heat-treating methods and systems claimed and exemplified herein.

Pre-heating Device

Still referring to FIG. 2, in this embodiment, the pre-heating device 32, or more particularly the first irradiance source 40, includes an arc lamp 62. More particularly, in this embodiment the arc lamp 62 is a 500 kW water wall argon plasma arc lamp available from Vortek Industries Ltd. of Vancouver, British Columbia, Canada. Such arc lamps provide numerous advantages for semiconductor annealing as compared to tungsten filament lamp sources. For example, as a result of the low thermal mass of argon plasmas, the response time of the arc lamp 62 is on the order of 0.2 ms or less, which is not only faster than a thermal conduction time of a silicon wafer but is also three orders of magnitude faster than response times of typical tungsten filament lamps, which permits a faster thermal cycle resulting in less dopant diffusion than tungsten filament annealing systems. In addition, the arc lamp 62 produces over 95% of its spectral distribution below the 1.2 $\mu$m band gap absorption of cold silicon, as compared to 40% for typical tungsten lamp sources, resulting in greater heating efficiency. Also, the plurality of tungsten filament lamps in a typical tungsten annealing system are not perfectly calibrated with one another and their irradiance spectra also change over time due to changes in the filament, accumulation of deposits on lamp bulb surfaces, etc. Therefore, the use of the single arc lamp 62, whose irradiance does not appreciably change over time, increases the uniformity of irradiation of the workpiece, resulting in lower thermal gradients in the workpiece and less corresponding thermal damage to the lattice, and eliminates the need for frequent calibration and re-calibration of a large number of energy sources such as an array of tungsten lamps, for example. Similarly, the long lifetime of the arc lamp 62 eliminates the need for frequent replacement and re-calibration of burned-out bulbs. Alternatively, however, other types of pre-heating devices may be substituted.

In this embodiment the pre-heating device 32 further includes a reflector 64. More particularly, in this embodiment the reflector 64 is formed by a series of flat segments forming a trough shape, so as to cooperate with the arc lamp 62 to produce a generally uniform irradiance field. Such reflectors are manufactured by Vortek Industries Ltd., of Vancouver, Canada, for example. Alternatively, the reflector may be omitted or replaced with other reflectors, although it is desirable that the irradiance field be generally uniform.

The arc lamp 62 is positioned at a focal point of the reflector 64, and the arc lamp and the reflector are positioned to irradiate the first side 42 of the workpiece 34 with a substantially uniform irradiance field at an angle of incidence of 45 degrees relative to the surface of the first side 42 of the workpiece.

In this embodiment, the black chamber 48 further includes a quartz window 65 extending between the walls 52 and 56 of the black chamber. The quartz window 65 serves to isolate the arc lamp 62 and reflector 64 from the interior of the black chamber 48, to prevent contamination of the workpiece.

The pre-heating device of the present embodiment is operable to pre-heat the workpiece at a rate of at least 250° C. per second, or more particularly, at a rate of at least 400° C. per second. To achieve such ramp rates, the arc lamp 62 is capable of irradiating the first side 42 of the workpiece with an intensity of approximately $1 \times 10^2$ W/cm$^2$ to achieve a ramp rate moderately in excess of 250° C./s, or an intensity of approximately $1.4 \times 10^2$ W/cm² to achieve a ramp rate moderately in excess of 400° C./s, such radiation intensities being determined by the input power supplied to the arc lamp. Alternatively, the arc lamp is capable of accepting a continuous range of input power levels and accordingly, faster or slower ramp rates may be substituted, although slower rates tend to result in increased dopant diffusion, and much faster rates (on the order of the thermal lag time of the workpiece, for example) may result in larger thermal gradients in the workpiece. For example, ramp rates on the order of 50° C./s may well be adequate for some applications, whereas much faster ramp rates may be acceptable for other applications.

Additionally, in the present embodiment the system 30 includes a corrective energy source 66 mounted beneath a quartz window 67 in the wall 52 of the black chamber 48. The corrective energy source supplies additional heating to cooler regions of the workpiece 34 during a thermal cycle, to increase the uniformity of the temperature distribution in the workpiece, thereby reducing lattice damage caused by thermal stresses. More particularly, in this embodiment the corrective energy source is similar to that disclosed in the above-noted commonly-owned Patent Cooperation Treaty Application Publication No. WO 00/67298. Alternatively, however, the corrective energy source may be omitted entirely, or other types of corrective energy sources may be substituted.

Heating Device

In this embodiment, the heating device 36, or more particularly the second irradiance source 44, includes a flash lamp 68. The flash lamp is somewhat similar to the arc lamp 62, but also includes a power supply system 69 that may be pre-charged then abruptly discharged in order to supply a "spike" of input power to the flash lamp 68. More particularly, in this embodiment the flash lamp includes a replaceable flash bulb manufactured by ILC Technology of Sunnyvale Calif., and the power supply system 69 of the flash lamp includes a power supply model number PS5010 manufactured by EKSMA Company of Vilnius, Lithuania. Alternatively, other types of power supplies operable to supply abrupt spikes of input power, other types of flash lamps, or more broadly, other heating devices, may be substituted.

In response to a discharge of the power supply system 69, the flash lamp 68 is operable to produce a flash of electromagnetic radiation with a power output of 4–6 MW ranging from 1–5 ms in duration. For example, a 6 MW flash of 1 ms duration may be advantageous for some applications. By producing such a flash when the workpiece is at the intermediate temperature, the heating device 36 is operable to heat the surface 38 of the workpiece from the intermediate temperature to a desired temperature of at least about 1050° C.

The flash lamp 68 is advantageous for the purposes of the present embodiment, in comparison to other ultra-fast heating devices. For example, although excimer lasers have been previously used for some annealing purposes, the monochromatic radiation produced by a laser tends to give rise to optical interference effects produced by thin films which coat the surface of a semiconductor workpiece and which are intentionally laterally inhomogeneous. Such optical interference effects produce lateral temperature gradients which result in thermal stress damage to the lattice of the workpiece. The flash lamp 68 is less susceptible to such interference effects than lasers, due to the broader spectrum of the electromagnetic radiation produced by the flash lamp.

In addition, laser annealing typically requires multiple heating cycles, such as hundreds of cycles for example, to anneal the entire workpiece surface, and accordingly, if a laser were substituted as the heating device, the workpiece would spend a longer amount of time at the intermediate temperature, resulting in deeper dopant diffusion. Also, use of a laser as the heating device tends to produce lower quality junctions than the flash lamp, resulting in higher current leakage. In addition, the faster ramp time associated with lasers (typically two orders of magnitude faster than that associated with the flash lamp) tends to produce higher thermal gradients, increasing the likelihood of lattice damage. Finally, due to the extremely shallow heat penetration resulting from laser annealing, it is sometimes not possible to achieve proper annealing of a desired layer such as a thin gate that lies underneath an intervening layer, due to "shadowing" by the intervening layer, whereas in contrast the flash lamp tends to heat the entire surface region including the intervening and underlying layer to sufficient annealing temperatures.

Alternatively, however, if desired, other types of heating devices may be substituted for the flash lamp 68. For the purposes of the present embodiment, it is desirable that any alternative heating device have a response time faster than the thermal conduction time of the workpiece 34 (typically on the order of 10–15 ms) and be capable of heating the second side 46 of the workpiece from the intermediate temperature to the desired temperature in less time than the thermal conduction time of the workpiece, so that the bulk of the workpiece 34 will remain at substantially the intermediate temperature in order for the bulk to act as a heat sink to facilitate rapid cooling of the second side 46 from the desired temperature to the intermediate temperature.

In this embodiment the heating device 36 further includes a reflector 70. More particularly, in this embodiment the reflector 70 is formed by a series of flat segments forming a trough shape, so as to cooperate with the flash lamp 68 to produce a generally uniform irradiance field. Such reflectors are manufactured by Vortek Industries Ltd., of Vancouver, Canada, for example. Alternatively, the reflector may be omitted or replaced with other reflectors, although it is desirable that the irradiance field be generally uniform.

The flash lamp 68 is positioned at a focal point of the reflector 70, and the flash lamp and the reflector are positioned to irradiate the second side 46 of the workpiece 34 with a substantially uniform irradiance field at an angle of incidence of 45 degrees relative to the surface of the second side 46 of the workpiece.

In this embodiment, the black chamber 48 further includes a quartz window 71 extending between the walls 50 and 54 of the black chamber. The quartz window 71 serves to isolate the flash lamp 68 and the reflector 70 from the interior of the black chamber 48, to prevent contamination of the workpiece.

Control Device

In this embodiment, the system 30 further includes a processor circuit 72, which in the present embodiment is housed within a general purpose computer 74. The processor circuit 72 is in communication with the pre-heating device 32 and the heating device 36. In addition, in embodiments such as the present embodiment in which the temperature indicator 60 and the corrective energy source 66 are provided, the processor circuit is in further communication with such devices.

In this embodiment, the computer 74 further includes a storage device 76 in communication with the processor circuit 72. More particularly, the storage device 76 includes a hard disk drive and a random access memory. The computer 74 further includes an input device 78, which in this embodiment is a keyboard, and an output device 80, which in this embodiment is a color monitor. Alternatively, however, other storage, input and output devices may be substituted. Or, as a further alternative, the processor circuit may be omitted entirely and replaced with any other suitable means for controlling the pre-heating and heating devices 32 and 36 in accordance with the methods exemplified herein.

Operation

Figure 3:
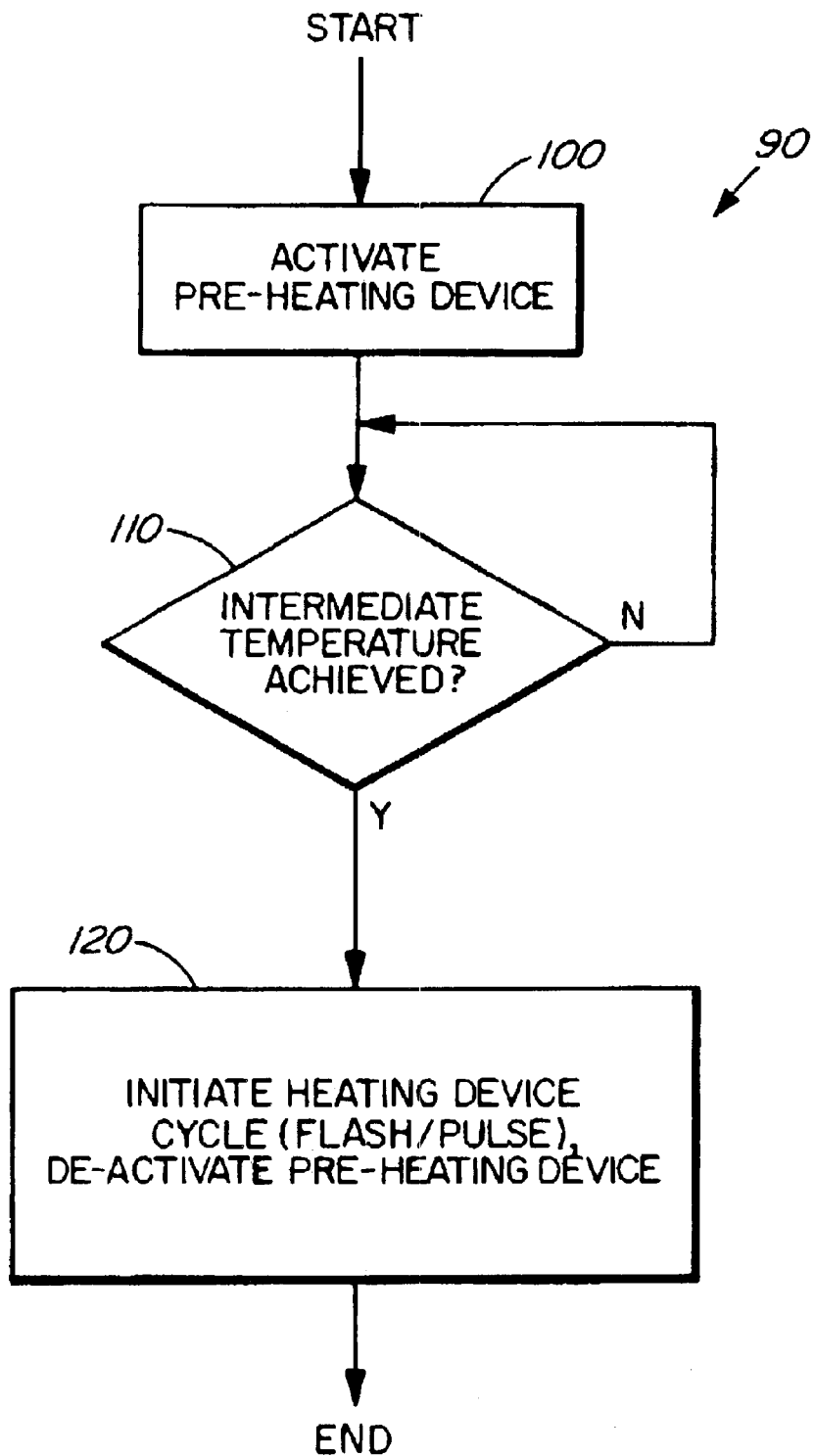
FIG. 3 is a flowchart of a heat-treating routine executed by a processor circuit of the system shown in FIG. 2.
Figure 4:
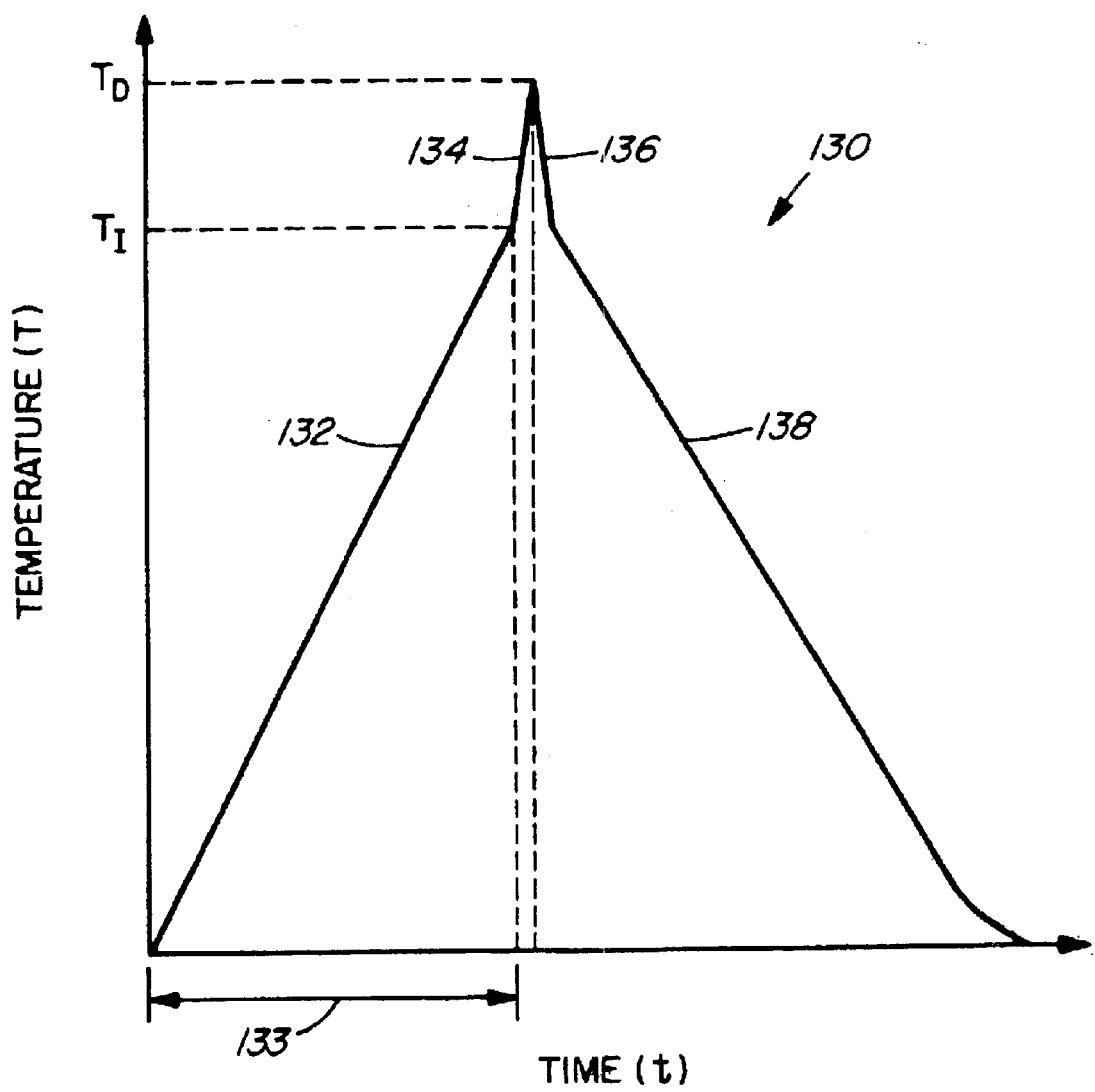
FIG. 4 is a graphical representation of a temperature-time profile of a surface of the workpiece shown in FIG. 2 during a thermal cycle according to the second embodiment of the invention.

Referring to FIGS. 2, 3 and 4, in this embodiment the storage device 76 shown in FIG. 2 stores blocks of codes for directing the processor circuit 72 to execute a heat-treating routine shown generally at 90 in FIG. 3. The heat-treating routine is executed by the processor circuit in response to user input received at the user input device 78 indicating that a heat-treating cycle is to commence.

Generally, in this embodiment, the heat-treating routine 90 configures the processor circuit 72 to control the pre-heating device 32 and the heating device 36 to increase a temperature of the workpiece 34 over a first time period to an intermediate temperature, and to heat the surface 38 of the workpiece 34 to a desired temperature greater than the intermediate temperature, the heating commencing within less time following the first time period than the first time period. In this embodiment the desired temperature is greater than the intermediate temperature by an amount less than or equal to about one-fifth of a difference between the intermediate temperature and an initial temperature of the workpiece.

Generally, throughout the execution of the heat-treating routine 90, the walls 50, 52, 54 and 56 of the black chamber 48 absorb radiation reflected and thermally emitted by the workpiece 34, and the cooling system 58 cools these walls to prevent them from becoming hot in response to such absorption which would otherwise result in re-emission of absorbed energy by the walls as blackbody radiation. Alternatively, however, such absorption and cooling may be omitted at the expense of temperature uniformity in the workpiece during the execution of the heat-treating routine.

The heat-treating routine 90 begins with a first block 100 of codes shown in FIG. 3, which directs the processor circuit 72 to increase a temperature of the workpiece 34 over a first time period to an intermediate temperature. To achieve this, block 100 directs the processor circuit to activate the pre-heating device 32, or more particularly the first irradiance source 40, to irradiate the first side 42 of the workpiece 34 to pre-heat the workpiece to an intermediate temperature. More particularly, block 100 directs the processor circuit to control the arc lamp 62 shown in FIG. 2 to continuously irradiate the first side 42 of the workpiece with a constant radiation intensity of approximately $1.4 \times 10^2$ W/cm$^2$, which it has been found is sufficient to pre-heat the workpiece at a ramp rate moderately in excess of 400° C./s. Thus, in this embodiment irradiating the workpiece involves exposing the workpiece to electromagnetic radiation produced by an arc lamp.

Block 100 also directs the processor circuit 72 to initialize the heating device 36, which in this embodiment is achieved by charging the power supply system 69 of the flash lamp 68 shown in FIG. 2.

In addition, in embodiments in which the corrective energy source 66 shown in FIG. 2 is to be used, block 100 further directs the processor circuit 72 to control the corrective energy source 66 to produce a desired spatial temperature distribution across the workpiece during the pre-heating stage, as described in detail in the above-noted commonly-owned PCT Patent Application Publication No. WO 00/67298. Alternatively, the corrective energy source may be omitted.

Block 110 then directs the processor circuit 72 to determine whether the intermediate temperature has been achieved in the workpiece. In this embodiment, block 110 directs the processor circuit to achieve this by monitoring signals received from the temperature indicator 60 shown in FIG. 2 indicative of the temperature of the workpiece 34. Alternatively, however, block 110 may direct the processor circuit to act as a temperature indicator, to produce an indication of a temperature of the workpiece based on the time elapsed since the pre-heating device was activated at block 100, in view of a predicted heating rate corresponding to the intensity of radiation incident upon the workpiece, to determine whether the intermediate temperature has been achieved. Although the magnitude of the intermediate temperature will vary from application to application, in the present embodiment the intermediate temperature is 1000° C. and therefore, this temperature will be achieved in the workpiece after approximately 2.5 seconds of irradiation of the workpiece by the pre-heating device 32. In effect, therefore, blocks 100 and 110 direct the processor circuit to control the pre-heating device 32 to pre-heat the workpiece for a time period greater than a thermal conduction time of the workpiece (which is on the order of 10–15 ms).

Upon determining at block 110 that the intermediate temperature has been achieved in the workpiece 34, block 120 directs the processor circuit 72 to heat the surface 38 of the workpiece 34 to a desired temperature that is greater than the intermediate temperature by an amount less than or equal to about one-fifth (or more particularly, less than or equal to about one-twentieth) of a difference between the intermediate temperature and the initial temperature of the workpiece. In this embodiment, this heating stage commences within less time following the first time period (during which the workpiece temperature was increasing to the intermediate temperature) than the first time period. More particularly, as a result of the execution of blocks 110 and 120, the heating device 36 is operable to commence the heating of the surface 38 of the workpiece in response to the indication from the temperature indicator 60 that the temperature of the workpiece 34 is at least the intermediate temperature, or alternatively, where the temperature indicator is omitted for example, the heating device is operable to commence such heating at an end of the first time period (during which the temperature of the workpiece was increasing to the intermediate temperature). Alternatively, for some applications it may be desirable to delay commencement of the heating stage until slightly after the deactivation of the pre-heating device, to allow for the thermal lag of the workpiece (on the order of 10–15 ms). However, any longer delays in commencing this heating stage will tend to increase dopant diffusion in the workpiece. Therefore, in general it is preferable not to delay the commencement of the heating stage at all, but if a delay is desired for a particular application, it is generally undesirable to "hold" the workpiece temperature at the intermediate temperature for longer than the time taken to heat the workpiece from its initial temperature to the intermediate temperature.

To commence the heating stage in the present embodiment, block 120 directs the processor circuit 72 to deactivate the pre-heating device 32 (including the corrective energy source 66 if a corrective energy source is provided), and to activate the heating device 36 to heat the surface 38 of the workpiece to the desired temperature. More particularly, in this embodiment, block 120 directs the processor circuit 72 to commence the heating stage by controlling the second irradiance source 44 to irradiate the second side 46 of the workpiece 34 to heat the second side to the desired temperature, which is greater than the intermediate temperature. The processor circuit is directed to achieve this by signaling the flash lamp 68 shown in FIG. 2, to cause the flash lamp power supply system 69 to be discharged to produce a short-duration, high energy arc in the flash lamp, which irradiates the surface 38 of the workpiece at a power of approximately 5 MW, for a duration on the order of 1 ms. Thus, in this embodiment irradiating the surface 38 involves exposing the surface to electromagnetic radiation produced by a flash lamp.

This flash heats the surface 38 of the workpiece to the desired temperature, which in this embodiment is 1050° C. At this high temperature and corresponding high kinetic energies, the dopant atoms implanted in the surface 38 of the workpiece tend to eject silicon atoms from the lattice and occupy substitutional lattice sites formerly occupied by silicon atoms. The dopants thereby become electrically activated. The displaced silicon atoms tend to migrate toward interstitial sinks such as the surface 38 of the workpiece, where they tend to be consumed by other processes such as oxidation.

The heat-treating routine 90 is then ended.

Referring to FIG. 4, a temperature-time profile of the surface 38 of the workpiece 34 resulting from the foregoing execution of the heat-treating routine 90 is shown generally at 130. The temperature-time profile 130 has four distinct stages, namely, a bulk pre-heating stage 132, a surface heating stage 134, a surface cooling stage 136 and a bulk cooling stage 138.

Referring to FIGS. 2, 3 and 4, the bulk pre-heating stage 132 results from the execution by the processor circuit 72 of blocks 100 and 110, and serves to increase the temperature of the workpiece 34 over a first time period 133 from its initial temperature to the intermediate temperature. More particularly, in this embodiment, the pre-heating device 32 increases the temperature of the entire workpiece 34 from its initial temperature (room temperature) to an intermediate temperature of 1000° C. at a ramp rate of approximately 400° C. per second. Preheating the workpiece in this manner to the intermediate temperature, and in particular to an intermediate temperature that is relatively close to the desired temperature, serves to reduce the magnitude of the temperature gradients that occur in the workpiece during the subsequent surface heating stage 134 and therefore serves to reduce thermal stress damage to the lattice of the workpiece, in comparison to techniques such as laser annealing or microwave annealing. However, the relatively fast ramp rate of the bulk pre-heating stage 132 and the correspondingly short time period spent by the workpiece at high temperatures results in much less dopant diffusion in the workpiece than other cycles that use slower ramp rates or that hold the workpiece at an intermediate temperature before the subsequent heating stage. In other words, in this embodiment, the duration of the bulk pre-heating stage 132, while longer than the thermal conduction time of the workpiece, is short compared to a characteristic time required for unacceptable diffusion to occur at the temperatures obtained during the bulk pre-heating stage.

The surface heating stage 134 results from the flash produced by the heating device 36 at block 120, and serves to heat the surface 38 of the workpiece from the intermediate temperature to the desired temperature. As shown in FIG. 4, such heating of the surface commences within less time following the first time period 133 than the first time period 133; indeed, in this embodiment the heating commences immediately following the end of the first time period 133, as soon as the intermediate temperature is achieved in the workpiece 34. In this embodiment the flash increases the temperature of the surface 38 from the intermediate temperature of 1000° C. to the desired annealing temperature of 1050° C. in approximately one millisecond. Due to the short duration of the flash (on the order of 1 ms), the heating device 36 is operable to heat the surface 38 of the workpiece for a time period less than a thermal conduction time of the workpiece (on the order of 10–15 ms). Therefore, the heating device 36 heats the surface 38 of the workpiece much faster than such heat can conduct away from the surface 38 and into the workpiece, and as a result, the bulk of the workpiece remains substantially at the intermediate temperature while the surface 38 is heated to the desired temperature.

Thus, during the surface cooling stage 136 that immediately follows the flash, the relatively cold bulk of the workpiece 34 acts as a heat sink for the surface 38, allowing the surface 38 to cool at a significantly faster rate than it would have cooled if the entire workpiece had been heated to the desired temperature. This rapid cooling continues until the surface 38 has reached the same temperature as the remainder of the workpiece 34 (approximately the intermediate temperature). Typically, the duration of this surface cooling stage 136 is on the order of the duration of the surface heating stage 134.

As a result of this ultra-fast heating and cooling during the surface heating and cooling stages 134 and 136, the surface 38 of the workpiece spends considerably less time in the high temperature range between the intermediate temperature and the desired temperature than it would have if the entire workpiece had been heated to the desired temperature. As most of the undesirable dopant diffusion occurs at or near the desired annealing temperature, this ultra-fast heating and cooling results in less dopant diffusion, allowing for the formation of shallower p+/n junctions than previous arc lamp or filament lamp annealing systems. At the same time, because the desired temperature exceeds the intermediate temperature by an amount less than or equal to about one-fifth (or more advantageously in the present embodiment, less than or equal to about one-twentieth) of the difference between the intermediate and initial temperatures, the temperature gradients in the workpiece during these heating and cooling stages are much smaller than those that occur in conventional laser annealing techniques, resulting in less thermal stress damage to the crystal lattice.

When the surface 38 has cooled to the same temperature as the bulk of the workpiece 34 (approximately the intermediate temperature), the bulk cooling stage 138 then commences, in which the surface 38 cools along with the bulk of the workpiece 34. In this embodiment, such cooling results largely from blackbody radiation thermally emitted by the hot workpiece, but also results partly from convection involving gases (if any) in the vicinity of the workpiece. The rate of such bulk cooling is strongly dependent on temperature and also depends on other factors such as the absorptiveness or reflectivity of the chamber, for example. In this embodiment the bulk cooling stage initially commences at a ramp rate of approximately −180° C./s, although this rate decreases somewhat as the workpiece cools. Advantageously, the radiation absorbing properties of the black chamber 48 allow faster bulk cooling rates than reflective chambers.

Although only a single heat-treating routine 90 was described above for illustrative purposes, alternatively a plurality of different heat-treating routines may be stored in the storage device 76 for directing the processor circuit 72 to control the system 30 to execute a plurality of different corresponding thermal heat-treating cycles for different applications. For example, the workpiece 34 may be preheated for different times and/or at different rates to different intermediate temperatures, and the second side 46 of the workpiece may then be heated with different power levels for different durations to different desired temperatures, depending upon the particular application.

Alternatives

If desired, pre-heating devices and heating devices other than the arc lamp and flash lamp may be substituted.

Figure 5:
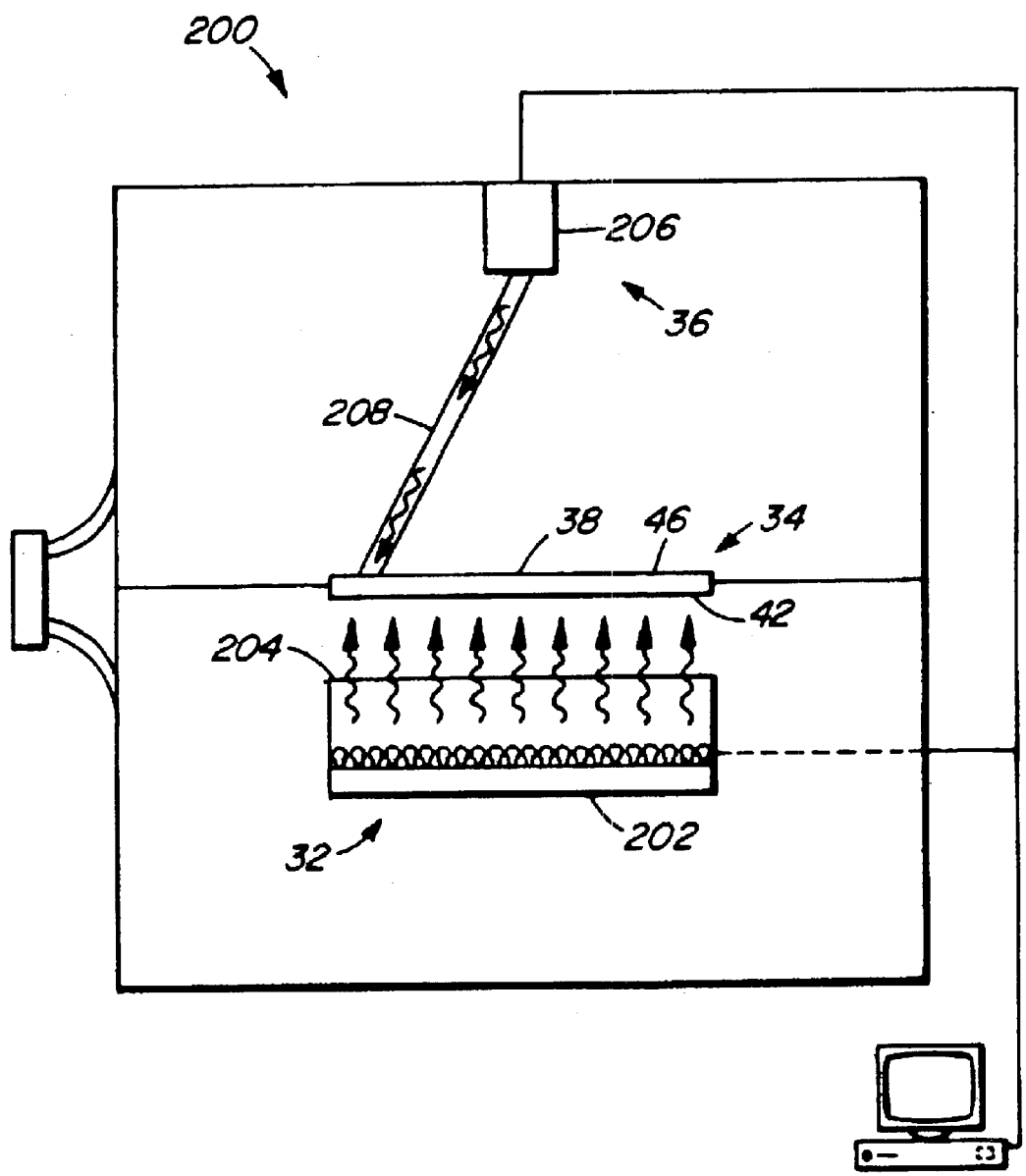
FIG. 5 is a side view of a system for heat-treating a workpiece according to a third embodiment of the invention (shown with a side wall removed)

For example, referring to FIGS. 2 and 5, a system for heat-treating a workpiece according to a third embodiment of the invention is shown generally at 150 in FIG. 5. In this embodiment, the pre-heating device 32 includes an alternative irradiance source, which in this embodiment includes at least one filament lamp. Thus, in this embodiment, irradiating the workpiece involves exposing the workpiece to electromagnetic radiation produced by at least one filament lamp. More particularly, in this embodiment the pre-heating device 32 includes a disc-shaped array 202 of tungsten filament lamps operable to project electromagnetic radiation through a quartz window 204 to irradiate the first side 42 of the workpiece 34, to pre-heat the workpiece to the intermediate temperature. Although there are numerous advantages to using an arc lamp rather than a tungsten filament lamp array as the pre-heating device, as discussed earlier herein, the deeper dopant diffusion that tends to result from tungsten filament lamps may not necessarily be fatal for all applications, depending on the performance requirements in a particular application.

As a further example, still referring to FIGS. 2 and 5, in the alternative system 150 shown in FIG. 5, irradiating the surface 38 involves moving a laser beam across the surface. More particularly, in this embodiment the heating device 36 includes an excimer laser 206 operable to move a laser beam 208 across the surface 38 of the workpiece 34. The excimer laser 206 is operable to produce a rapid laser pulse, on the order of microseconds or nanoseconds in duration, to heat the surface 38 to the desired temperature. Although the laser 206 may suffice for applications where the increased thermal stress damage to the lattice of the workpiece is not critical, it is noted that in general, the flash lamp 68 shown in FIG. 2 is preferred, for reasons discussed earlier herein.

Figure 6:
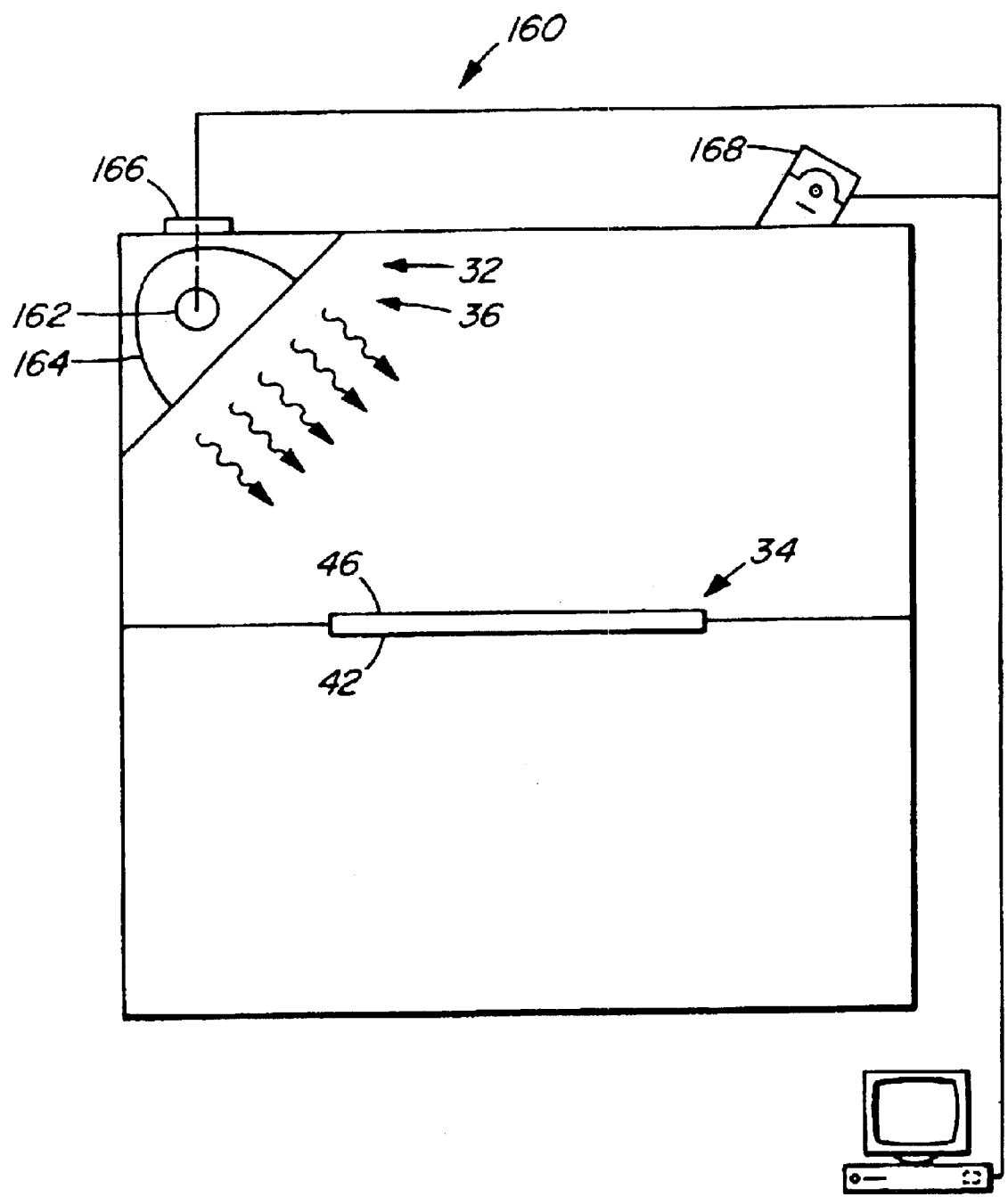
FIG. 6 is a side view of a system for heat-treating a workpiece according to a fourth embodiment of the invention (shown with a side wall removed)

Referring to FIGS. 2 and 6, a system for heat-treating a workpiece according to a fourth embodiment of the invention is shown generally at 160 in FIG. 6. In this embodiment, a single arc lamp 162 functions as both the pre-heating device 32 and the heating device 36. The arc lamp 162 is similar to the arc lamp 62 shown in FIG. 2 and includes an elliptical reflector 164 for providing a substantially uniform irradiance field to irradiate the second side 46 of the workpiece, which in this embodiment is a device side of a silicon semiconductor wafer. However, the arc lamp 162 further includes a power supply system 166 similar to the power supply system 69 of the flash lamp 68 shown in FIG. 2. The power supply system 166 is connected in parallel with a regular continuous power supply (not shown) of the arc lamp 162.

Thus, referring to FIGS. 2, 3, 4 and 6, the arc lamp 162 may be operated in a manner similar to the arc lamp 62 shown in FIG. 2 during the bulk pre-heating stage 132 shown in FIG. 4, in accordance with the execution by the processor circuit 72 of a modified block 100 of the heat-treating routine 90. When the intermediate temperature is achieved in the workpiece, a modified block 110 directs the processor circuit 72 to disconnect the regular continuous power supply to the arc lamp 162, and to discharge the power supply system 166 to provide an abrupt spike of power to the arc lamp 162, producing a flash of similar intensity and duration to that produced by the flash lamp 68 shown in FIG. 2. Although the system 160 shown in FIG. 6 may be less expensive than the system 30 shown in FIG. 2, the system 160 supplies 100% of the heating of the workpiece to the second side 46, which in this embodiment is the device side, of the workpiece. As the device side is much more inhomogeneous than the substrate side (the first side 42) of the workpiece, non-uniform absorption by devices on the device side may tend to produce greater lateral temperature gradients and corresponding thermal stress damage to the lattice of the workpiece than those that would occur using the system 30. This difficulty may be alleviated somewhat by providing the system 160 with an additional corrective energy source 168 locatable to supply additional heat to cooler areas of the device side, whose operation is similar to that of the corrective energy source 66 shown in FIG. 2.

Referring back to FIGS. 5 and 6, further variations in the nature, location and combinations of the pre-heating and heating devices 32 and 36 are possible. For example, lasers other than excimer lasers may be substituted for the flash lamp 68 to act as the heating device 36. Or, different types of tungsten filament arrays, such as a linear tungsten lamp array, may be substituted for the arc lamp 62 to act as the pre-heating device 32.

Figure 7:
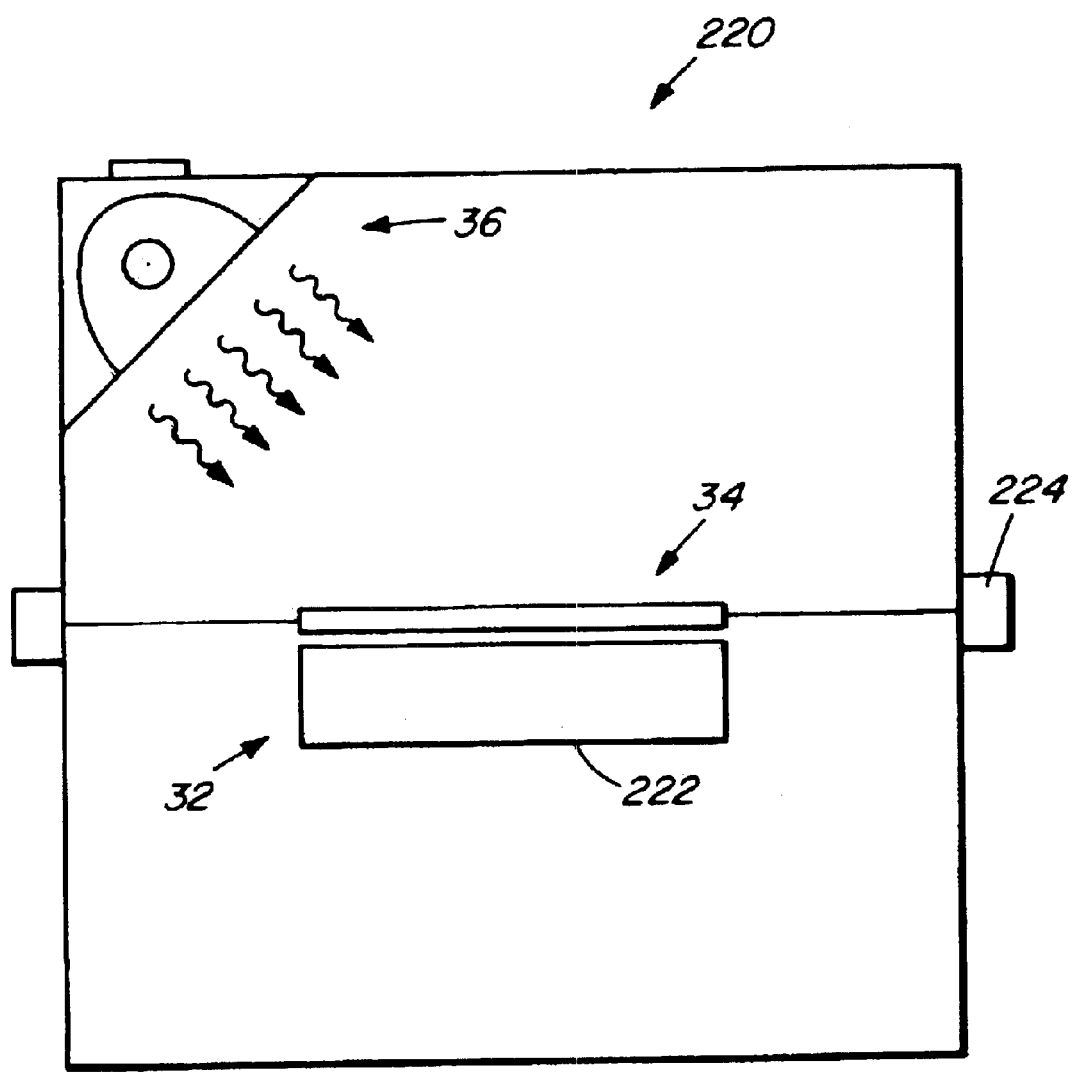
FIG. 7 is a side view of a system for heat-treating a workpiece according to a fifth embodiment of the invention (shown with a side wall removed).

As a further alternative, referring to FIGS. 2 and 7, a system for heat-treating a workpiece according to a fifth embodiment of the invention is shown generally 220 in FIG. 7. In this embodiment the pre-heating device 32 includes a radiant hot body 222 locatable to pre-heat the workpiece to the intermediate temperature. In this embodiment the hot body 222 is quartz, heated to approximately the intermediate temperature. Alternatively, other materials, such as silicon carbide, silicon, refractory metal, graphite, or a combination of such materials, for example, may be substituted. The hot body 222 is located in the black chamber 48 below the workpiece 34, in close proximity thereto, and is operable to pre-heat the workpiece by radiative heat transfer and also by convection and conduction through a thin layer of gas between the hot body 222 and the workpiece 34. Following the bulk pre-heating and surface heating stages 132 and 134, the hot body may be effectively "shut off" by moving the workpiece away from the hot body, or alternatively, by moving the hot body away from the workpiece. In this embodiment, this is achieved by a motorized mechanism 224 that slides the workpiece 34 out of the black chamber 48 following the surface heating stage.

Also, if separate pre-heating and heating devices are provided, the pre-heating and heating devices need not be on opposite sides of the workpiece: for example, if desired, the pre-heating device, such as a linear tungsten array, and a heating device such as a laser may be both located above the surface 38 of the workpiece, to irradiate the second or device side 46 of the workpiece (although, as noted, supplying 100% of the pre-heating and heating energy to the device side tends to produce greater temperature gradients and thermal stress damage).

Other combinations or permutations of the above-noted pre-heating and heating devices or equivalent devices may be provided. For example, an arc lamp may be provided as the pre-heating device and a laser as the heating device, or a tungsten filament array may be provided as the pre-heating device and a flash lamp as the heating device. These and other such variations may be apparent to one of ordinary skill in the art upon reviewing this specification, and are not considered to depart from the scope of the invention as construed in accordance with the accompanying claims.

More generally, while specific embodiments of the invention have been described and illustrated, such embodiments should be considered illustrative of the invention only and not as limiting the invention as construed in accordance with the accompanying claims.

What is claimed is:

1. A method of heat-treating a workpiece, the method comprising:
    a) increasing a temperature of the workpiece over a first time period to an intermediate temperature; and
    b) heating a surface of the workpiece to a desired temperature greater than said intermediate temperature, said heating commencing within less time following said first time period than said first time period.

2. The method of claim 1 wherein increasing comprises pre-heating the workpiece for a time period greater than a thermal conduction time of the workpiece.

3. The method of claim 1 wherein heating comprises heating said surface for a time period less than a thermal conduction time of the workpiece.

4. The method of claim 1 wherein heating said surface of the workpiece comprises commencing said heating at an end of said first time period.

5. The method of claim 1 further comprising producing an indication of a temperature of the workpiece.

6. The method of claim 5 wherein heating said surface comprises commencing said heating in response to an indication that said temperature of the workpiece is at least said intermediate temperature.

7. The method of claim 1 wherein increasing comprises irradiating the workpiece.

8. The method of claim 7 wherein irradiating comprises exposing the workpiece to electromagnetic radiation produced by an arc lamp.

9. The method of claim 7 wherein irradiating comprises exposing the workpiece to electromagnetic radiation produced by at least one filament lamp.

10. The method of claim 1 wherein heating said surface of the workpiece comprises irradiating said surface.

11. The method of claim 10 wherein irradiating comprises exposing said surface to electromagnetic radiation produced by a flash lamp.

12. The method of claim 10 wherein irradiating comprises moving a laser beam across said surface.

13. The method of claim 1 further comprising absorbing radiation reflected and thermally emitted by the workpiece.

14. The method of claim 13 wherein absorbing comprises absorbing said radiation in a radiation absorbing environment.

15. The method of claim 13 wherein absorbing comprises absorbing said radiation in at least one radiation absorbing surface.

16. The method of claim 15 further comprising cooling said at least one radiation absorbing surface.

17. The method of claim 1 wherein increasing comprises irradiating a first side of the workpiece to pre-heat the workpiece to said intermediate temperature, and wherein heating comprises irradiating a second side of the workpiece to heat said second side to said desired temperature.

18. A system for heat-treating a workpiece, the system comprising:
    a) a pre-heating device operable to increase a temperature of the workpiece over a first time period, to an intermediate temperature; and
    b) a heating device operable to heat a surface of the workpiece to a desired temperature greater than said intermediate temperature, and operable to commence said heating within less time following said first time period than said first time period.

19. The system of claim 18 wherein said pre-heating device is operable to pre-heat the workpiece for a time period greater than a thermal conduction time of the workpiece.

20. The system of claim 18 wherein said heating device is operable to heat said surface for a time period less than a thermal conduction time of the workpiece.

21. The system of claim 18 wherein said heating device is operable to commence said heating of said surface of the workpiece at an end of said first time period.

22. The system of claim 18 further comprising a temperature indicator operable to produce an indication of a temperature of the workpiece.

23. The system of claim 22 wherein said heating device is operable to commence said heating in response to an indication from said temperature indicator that said temperature of the workpiece is at least said intermediate temperature.

24. The system of claim 18 wherein said pre-heating device comprises means for irradiating the workpiece.

25. The system of claim 18 wherein said pre-heating device comprises an irradiance source operable to irradiate the workpiece.

26. The system of claim 25 wherein said irradiance source comprises an arc lamp.

27. The system of claim 25 wherein said irradiance source comprises at least one filament lamp.

28. The system of claim 18 wherein said pre-heating device comprises a hot body locatable to pre-heat the workpiece.

29. The system of claim 18 wherein said heating device comprises means for irradiating said surface.

30. The system of claim 18 wherein said heating device comprises an irradiance source operable to irradiate said surface.

31. The system of claim 30 wherein said irradiance source comprises a flash lamp.

32. The system of claim 29 wherein said irradiance source comprises a laser.

33. The system of claim 18 further comprising a radiation absorbing environment operable to absorb radiation reflected and thermally emitted by the workpiece.

34. The system of claim 18 further comprising at least one radiation absorbing surface operable to absorb radiation reflected and thermally emitted by the workpiece.

35. The system of claim 34 further comprising a cooling system operable to cool said at least one radiation absorbing surface.

36. The system of claim 18 wherein said heating device is operable to heat said surface to a desired temperature greater than said intermediate temperature by an amount less than or equal to about one-fifth of a difference between said intermediate and initial temperatures.

37. The system of claim 18 wherein said pre-heating device comprises a first irradiance source operable to irradiate a first side of the workpiece to pre-heat the workpiece to said intermediate temperature, and wherein said heating device comprises a second irradiance source operable to irradiate a second side of the workpiece to heat said second side to said desired temperature.

38. The system of claim 36 wherein said pre-heating device comprises a first irradiance source operable to irradiate a first side of the workpiece to pre-heat the workpiece to said intermediate temperature, and wherein said heating device comprises a second irradiance source operable to irradiate a second side of the workpiece to heat said second side to said desired temperature.

39. A system for heat-treating a workpiece, the system comprising:
   a) means for increasing a temperature of the workpiece over a first time period, to an intermediate temperature; and
   b) means for heating a surface of the workpiece to a desired temperature greater than said intermediate temperature, comprising means for commencing said heating within less time following said first time period than said first time period.

40. A method of heat-treating a workpiece, the method comprising:
   a) irradiating a first side of the workpiece to pre-heat the workpiece to an intermediate temperature; and
   b) irradiating substantially all of a second side of the workpiece within a time period less than a thermal conduction time of the workpiece to heat said second side to a desired temperature greater than said intermediate temperature.

41. The method of claim 40 wherein irradiating said first and second sides comprises irradiating a substrate side and a device side respectively of a semiconductor wafer.

42. The method of claim 40 wherein irradiating said first side comprises irradiating said first side for a time period greater than a thermal conduction time of the workpiece.

43. The method of claim 40 wherein irradiating said first side comprises exposing said first side to electromagnetic radiation produced by an arc lamp.

44. The method of claim 40 wherein irradiating said first side comprises exposing said first side to electromagnetic radiation produced by at least one filament lamp.

45. The method of claim 40 wherein irradiating said second side comprises exposing said second side to electromagnetic radiation produced by a flash lamp.

46. The method of claim 40 wherein irradiating said second side comprises moving a laser beam across said surface.

47. The method of claim 40 further comprising producing an indication of a temperature of the workpiece.

48. The method of claim 47 wherein irradiating said second side comprises commencing said irradiating of said second side in response to an indication that said temperature of the workpiece is at least said intermediate temperature.

49. The method of claim 40 further comprising absorbing radiation reflected and thermally emitted by the workpiece.

50. The method of claim 49 wherein absorbing comprises absorbing said radiation in a radiation absorbing environment.

51. The method of claim 49 wherein absorbing comprises absorbing said radiation in at least one radiation absorbing surface.

52. The method of claim 51 further comprising cooling said at least one radiation absorbing surface.

53. A system for heat-treating a workpiece, the system comprising:
   a) a first irradiance source operable to irradiate a first side of the workpiece to pre-heat the workpiece to an intermediate temperature; and
   b) a second irradiance source operable to irradiate substantially all of a second side of the workpiece within a time period less than a thermal conduction time of the workpiece to heat said second side to a desired temperature greater than said intermediate temperature.

54. The system of claim 53 wherein said first and second irradiance sources are locatable to irradiate a substrate side and a device side respectively of a semiconductor wafer.

55. The system of claim 53 wherein said first irradiance source is operable to irradiate said first side for a time period greater than a thermal conduction time of the workpiece.

56. The system of claim 53 wherein said first irradiance source comprises means for irradiating the workpiece.

57. The system of claim 53 wherein said first irradiance source comprises an arc lamp.

58. The system of claim 53 wherein said first irradiance source comprises at least one filament lamp.

59. The system of claim 53 wherein said second irradiance source comprises means for irradiating the workpiece.

60. The system of claim 53 wherein said second irradiance source comprises a flash lamp.

61. The system of claim 53 wherein said second irradiance source comprises a laser.

62. The system of claim 53 further comprising a temperature indicator operable to produce an indication of a temperature of the workpiece.

63. The system of claim 62 wherein said second irradiance source is operable to commence said irradiating of said second side in response to an indication from said temperature indicator that said temperature of the workpiece is at least said intermediate temperature.

64. The system of claim 53 further comprising a radiation absorbing environment operable to absorb radiation reflected and thermally emitted by the workpiece.

65. The system of claim 53 further comprising at least one radiation absorbing surface operable to absorb radiation reflected and thermally emitted by the workpiece.

66. The system of claim 65 further comprising a cooling system operable to cool said at least one radiation absorbing surface.

67. A system for heat-treating a workpiece, the system comprising:
   a) means for irradiating a first side of the workpiece to pre-heat the workpiece to an intermediate temperature; and
   b) means for irradiating substantially all of a second side of the workpiece within a time period less than a thermal conduction time of the workpiece to heat said second side to a desired temperature greater than said intermediate temperature.

* * * * *

UNITED STATES PATENT AND TRADEMARK OFFICE
CERTIFICATE OF CORRECTION

PATENT NO. : 6,963,692 B2
DATED : November 8, 2005
INVENTOR(S) : Camm et al.

It is certified that error appears in the above-identified patent and that said Letters Patent is hereby corrected as shown below:

<u>Title page,</u>
Item [75], Inventors, "J. Kiefer Elliot" should be -- J. Kiefer Elliott --.

<u>Column 17,</u>
Line 42, "Preheating the workpiece" should be -- Pre-heating the workpiece --.

Signed and Sealed this

Twenty-first Day of March, 2006

JON W. DUDAS
*Director of the United States Patent and Trademark Office*